United States Patent
Hyun et al.

(10) Patent No.: US 9,627,025 B2
(45) Date of Patent: *Apr. 18, 2017

(54) MEMORY DEVICE AND MEMORY SYSTEM INCLUDING THE SAME

(71) Applicant: SK hynix Inc., Gyeonggi-do (KR)

(72) Inventors: Sang-Ah Hyun, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,170

(22) Filed: Apr. 20, 2016

(65) Prior Publication Data

US 2016/0232960 A1 Aug. 11, 2016

Related U.S. Application Data

(63) Continuation of application No. 14/567,706, filed on Dec. 11, 2014, now Pat. No. 9,349,430.

(30) Foreign Application Priority Data

Sep. 11, 2014 (KR) .......................... 10-2014-0120243

(51) Int. Cl.

| | |
|---|---|
| *G11C 11/406* | (2006.01) |
| *G11C 11/408* | (2006.01) |
| *G11C 8/00* | (2006.01) |
| *G11C 8/12* | (2006.01) |
| *G11C 8/04* | (2006.01) |
| *G11C 11/4076* | (2006.01) |

(52) U.S. Cl.
CPC .............. *G11C 11/406* (2013.01); *G11C 8/04* (2013.01); *G11C 8/12* (2013.01); *G11C 11/408* (2013.01); *G11C 11/40611* (2013.01); *G11C 11/40618* (2013.01); *G11C 11/40622* (2013.01); *G11C 11/4076* (2013.01); *G11C 11/40615* (2013.01)

(58) Field of Classification Search
CPC ............ G11C 11/406; G11C 11/40615; G11C 11/408; G11C 11/40622; G11C 8/12; G11C 11/4076; G11C 11/40618
USPC ................. 365/230.03, 222, 236, 230.01
See application file for complete search history.

(56) References Cited

U.S. PATENT DOCUMENTS

| | | | | |
|---|---|---|---|---|
| 9,349,430 B2* | 5/2016 | Hyun | ..................... | G11C 11/408 |
| 2007/0019491 A1* | 1/2007 | Jang | ..................... | G11C 11/406 |
| | | | | 365/222 |

(Continued)

*Primary Examiner* — Ly D Pham
(74) *Attorney, Agent, or Firm* — IP & T Group LLP

(57) ABSTRACT

A memory device includes: a plurality of memory blocks; an address counting block suitable for generating a counting address that is changed when all the memory blocks are refreshed; a target address generation block suitable for generating a target address, which is an address of a word line requiring an additional refresh operation, in the memory blocks; and a refresh control block suitable for controlling a 1st number of the memory blocks to be refreshed when a refresh command is inputted a 1st number of times and controlling a 2nd number of the memory blocks to be refreshed when the refresh command is inputted a 2nd number of times, wherein the refresh control block controls a word line corresponding to the counting address to be refreshed and controls a word line corresponding to the target address to be refreshed during a target refresh operation.

8 Claims, 17 Drawing Sheets

(56) References Cited

U.S. PATENT DOCUMENTS

| | | | |
|---|---|---|---|
| 2007/0076504 A1* | 4/2007 | Suh .................... | G11C 11/406 365/222 |
| 2013/0016574 A1* | 1/2013 | Kim .................. | G11C 11/40622 365/189.07 |
| 2015/0043294 A1* | 2/2015 | Yang .................... | G11C 7/02 365/222 |

* cited by examiner

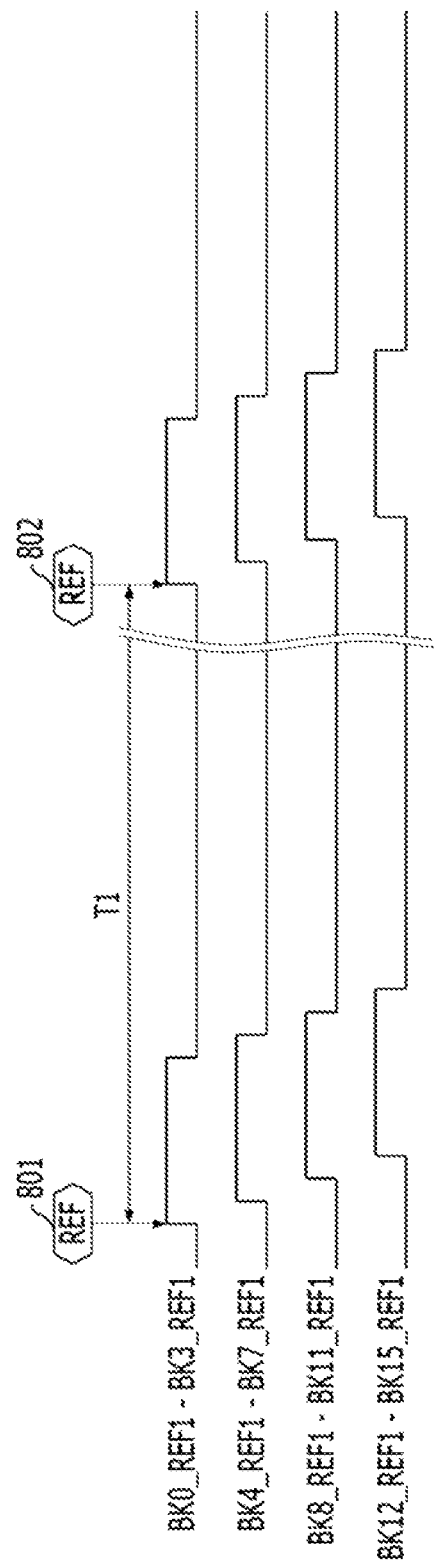

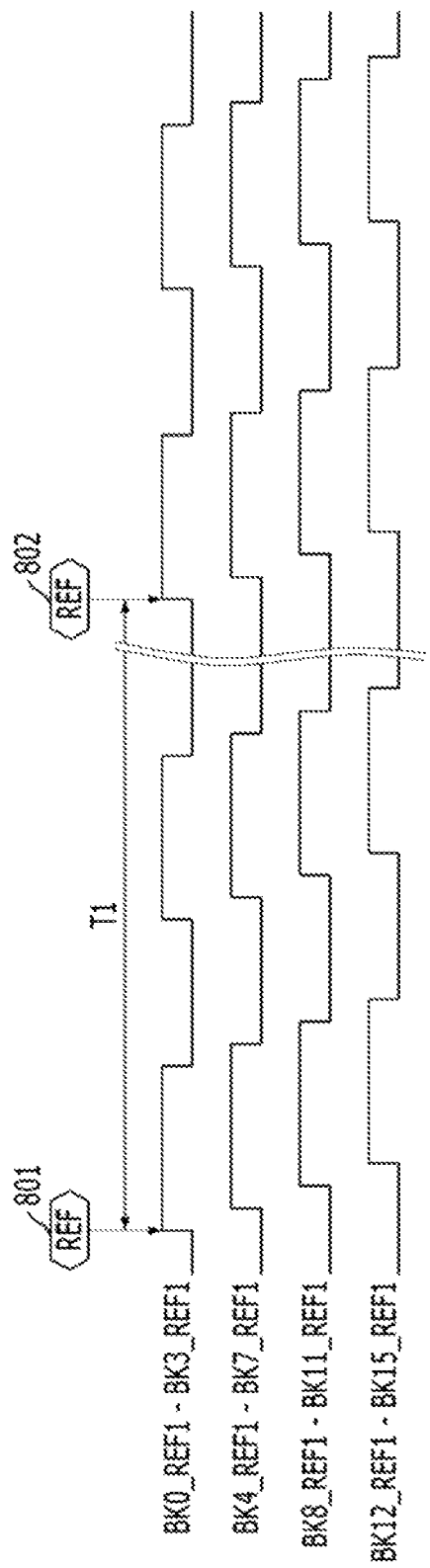

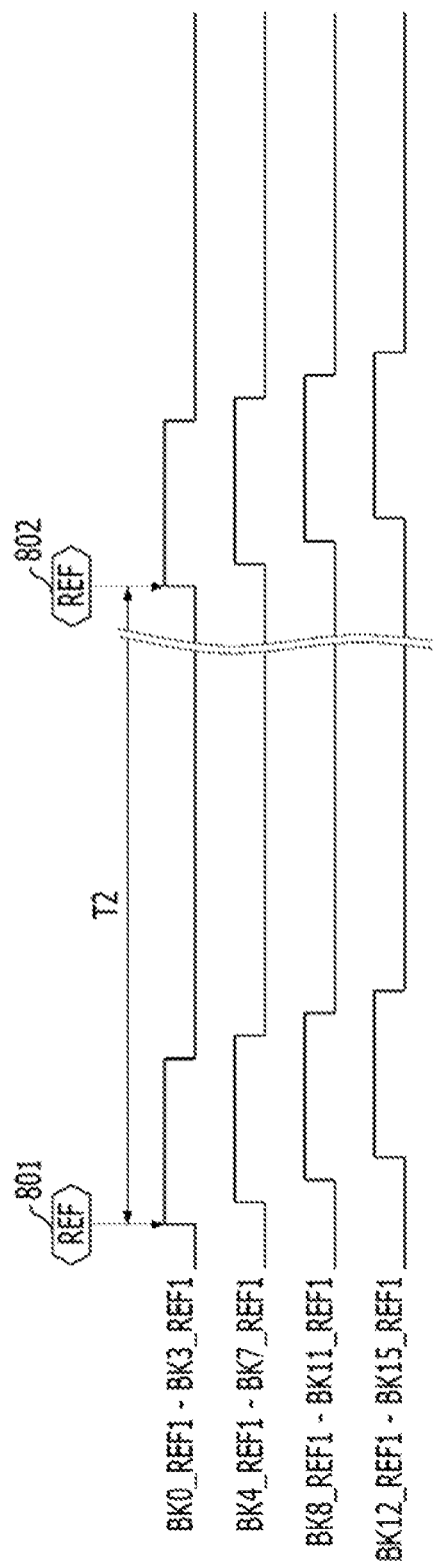

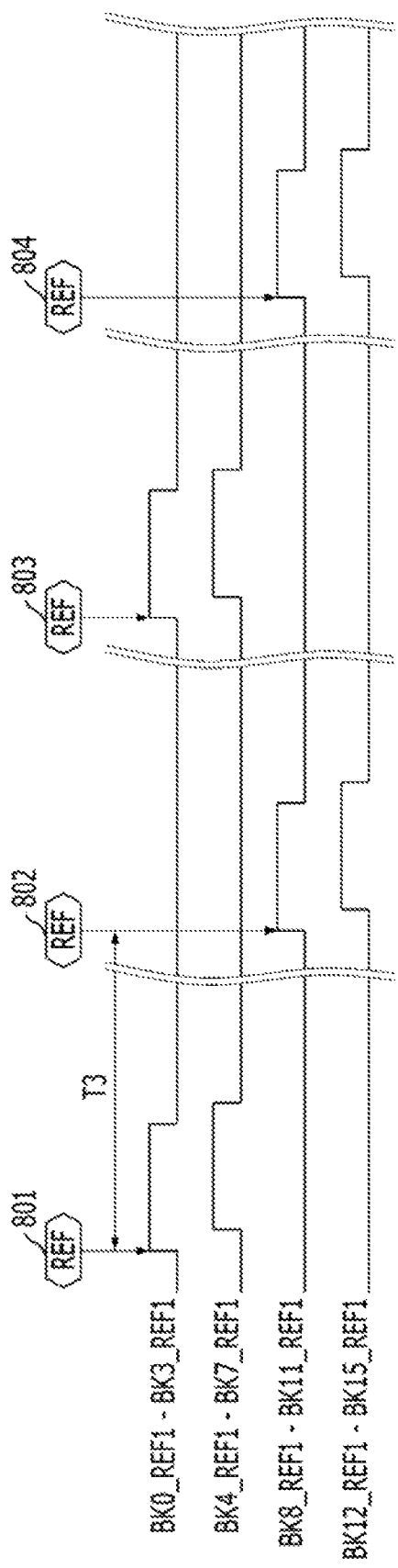

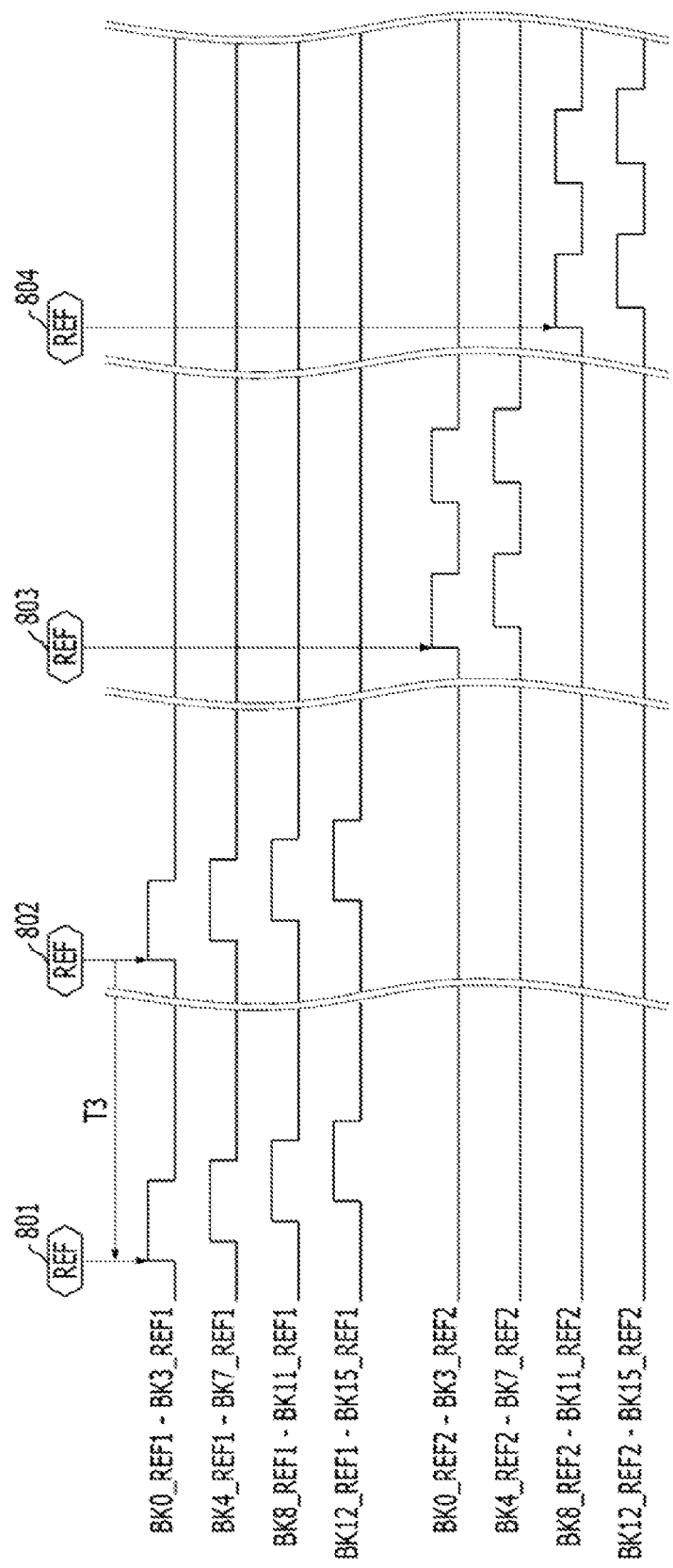

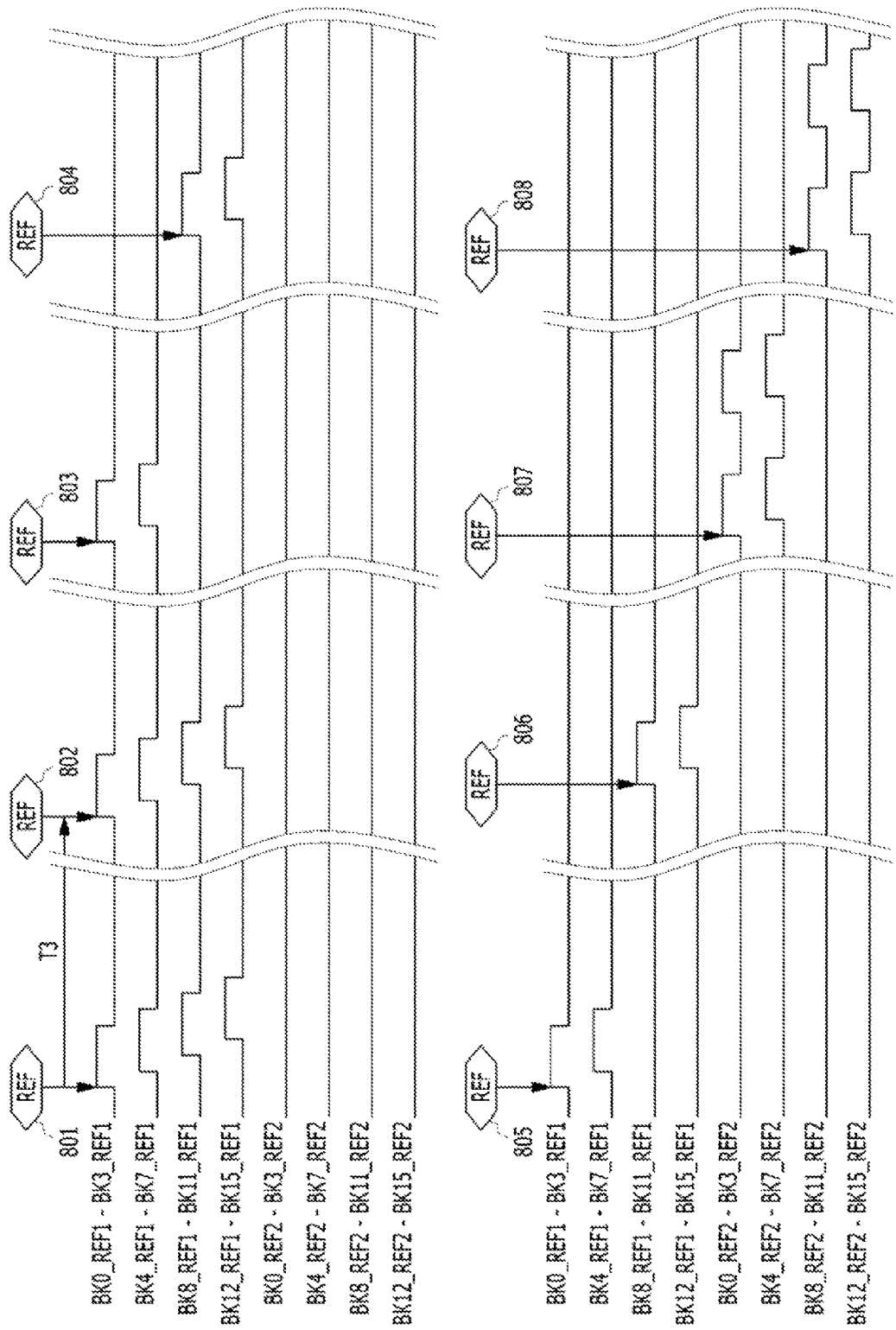

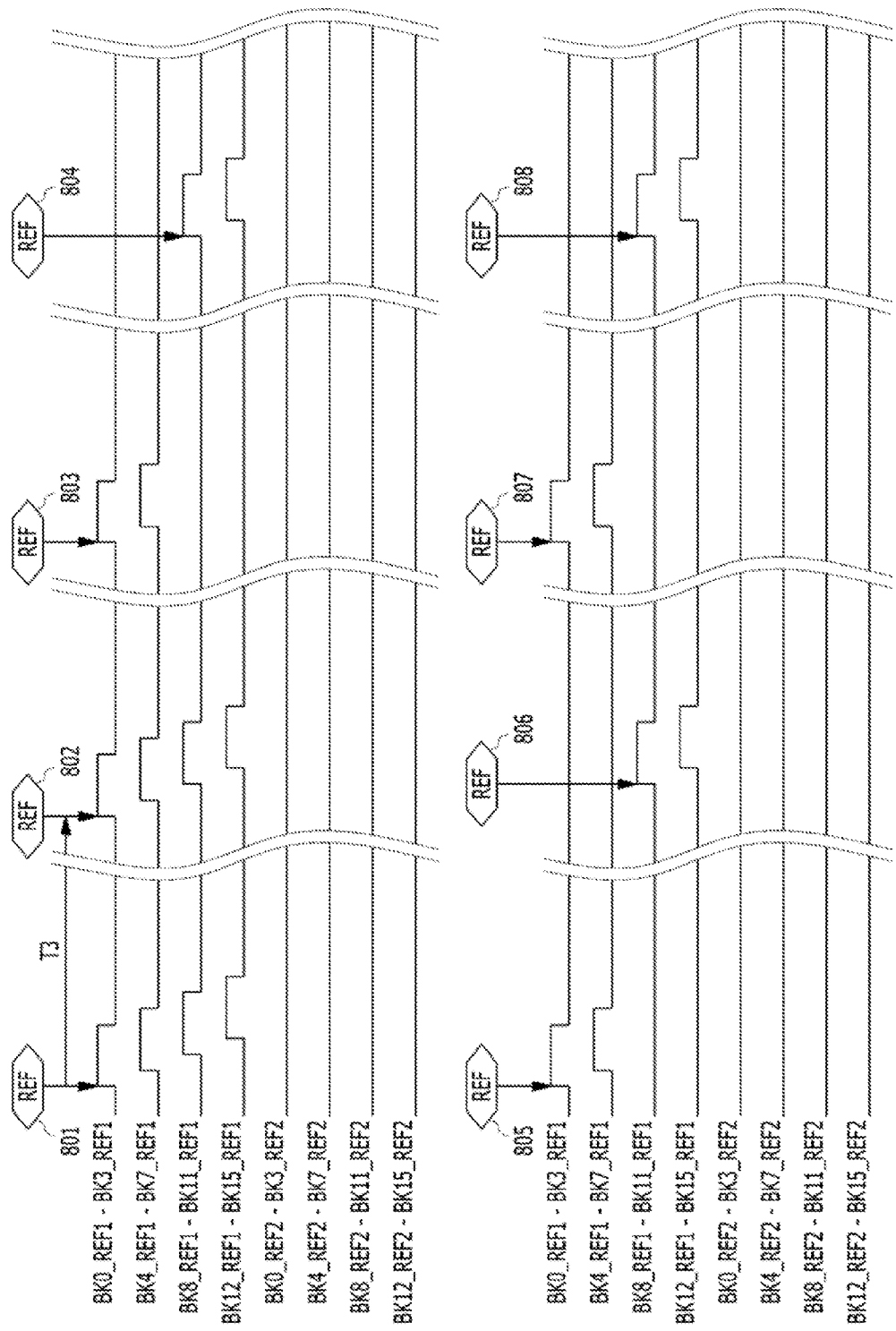

MEMORY DEVICE AND MEMORY SYSTEM INCLUDING THE SAME

CROSS-REFERENCE TO RELATED APPLICATIONS

This application is a continuation of U.S. patent application Ser. No. 14/567,706 filed on Dec. 11, 2014, which claims priority of Korean Patent Application No. 10-2014-0120243, filed on Sep. 11, 2014. The disclosure of each of the foregoing applications is incorporated herein by reference in its entirety.

BACKGROUND

1. Field

Exemplary embodiments of the present invention relate to a memory device and a memory system.

2. Description of the Related Art

A memory device includes a plurality of memory cells. Each memory cell of the memory device includes a transistor serving as a switch and a capacitor storing a charge, which represents data. Data is distinguished between a logic high level (logic value '1') and a logic low level (logic value '0') depending on whether there is a charge in the memory cell capacitor, in other words, whether the terminal voltage of the capacitor is high or low.

Data is stored in the form of a charge accumulated in the capacitor, and there is supposed to be no loss of stored data or charge, theoretically. However, because of current leakage in the PN junction of the MOS transistor, the initial charge accumulated in the capacitor may be lost, and consequently the data stored in the memory cell may be lost. To prevent data loss, the data stored in the memory cell is read and the charge is periodically recharged based on the read data before it is lost, which is called a refresh operation. The refresh operation allows the memory device to operate without data loss.

The refresh operation is performed whenever a refresh command is inputted from a memory controller to a memory. The memory controller inputs the refresh command to the memory at predetermined times in consideration of the memory cell's data retention time. Data retention time is defined as how long memory cell data charges may be retained without a refresh operation. Since memory cells included in a memory device are designed to have data retention time that is over a predetermined reference time, refresh operation intervals may be determined in consideration of the reference time.

However, when some memory cells have data retention times that are less than the reference time, due various internal or external factors, the data of the memory cells may not be refreshed fast enough and may be lost. Internal factors may include memory cell defects, such as reduced capacity in memory cell capacitors or high current leakage in memory cell transistors. External factors range from coupling effects on adjacent word lines to over-activated word lines.

FIG. 1 is a circuit diagram illustrating a portion of a cell array included in a memory device. In FIG. 1, BL represents a bit line.

Referring to FIG. 1, three word lines WLK−1, WLK, and WLK+1 are arranged in parallel in the cell array. The word line WLK, with notation "ATACK_ACT", that has been activated a high number of times (with high activation frequency) or activated for a long time. The word lines WLK−1 and WLK+1 are disposed adjacent to the word line WLK. Also, memory cells CELL_K−1, CELL_K, and CELL_K+1 are coupled with the word lines WLK−1, WLK, and WLK+1, respectively. The memory cells CELL_K−1, CELL_K and CELL_K+1 include cell transistors TR_K−1, TR_K, and TR_K+1 and cell capacitors CAP_K−1, CAP_K, and CAP_K+1, respectively.

When the word line WLK is activated frequently or for a long duration, the voltage of the word line WLK frequently toggles or is maintained at a high level for a long duration, thereby affecting the data stored in the memory cells CELL_K−1 and CELL_K+1, coupled with the word lines WLK−1 and WLK+1, due to coupling effects between the word line WLK and the word lines WLK−1 and WLK+1. Consequently, retention time of the data stored in the memory cells may be reduced.

SUMMARY

Exemplary embodiments of the present invention are directed to a memory device and a memory system capable of flexibly controlling the number of memory blocks where a refresh operation is performed at one time.

Also, the exemplary embodiments of the present invention are directed to memory device and a memory system capable of performing a target refresh operation as well as a normal refresh operation on each memory block as many as the predetermined number of times to satisfy an external command for the number of the memory blocks where the target or normal refresh operation is performed at one time by flexibly controlling the number of the memory blocks where the target or normal refresh operation is performed at one time.

In accordance with an embodiment of the present invention, a memory device includes: a plurality of memory blocks; an address counting block suitable for generating a counting address that is changed when all the memory blocks are refreshed; a target address generation block suitable for generating a target address which is an address of a word line requiring an additional refresh operation in the memory blocks; and a refresh control block suitable for controlling a 1st number of the memory blocks to be refreshed when a refresh command is inputted as many as a 1st number of times and controlling a 2nd number of the memory blocks to be refreshed when the refresh command is inputted as many as a 2nd number of times, wherein the refresh control block controls a word line corresponding to one or more of the counting address and the target address.

The refresh control block may set the 1st number of times and the 2nd 1st number of times based on a 1st predetermined number of times which is the number of times that the target refresh operation is performed on each of the memory blocks during a 1st period.

The refresh control block may control each of the memory blocks to be target-refreshed once during a time corresponding to N (N is natural number) times as long as the 1st period when the 1st predetermined number of times is set to 1/N.

The target address may be of a word line whose data retention time is shorter than data retention times of other word lines.

The target address may be of a word line adjacent to a word line whose active number of times is over a reference number of times, or active frequency is over a reference frequency, or active time is over a reference time.

The refresh control block may control the target refresh operation not to be performed when the 1st predetermined number of times is set to 0.

The refresh control block may include: a refresh counting unit suitable for counting the number of times that the refresh command is inputted and generating counting information; a 1st refresh control unit suitable for controlling the word line corresponding to the counting address to be refreshed in response to the refresh command; and a 2nd refresh control unit suitable for generating a target refresh signal corresponding to a target refresh section when the counting information corresponds to a 3rd number of times which is the same as the 1st number of times or the 2nd number of times and controlling the word line corresponding to the target address to be refreshed in response to the refresh command, wherein the 1st and 2nd refresh control units controls the 1st number of the memory blocks to be refreshed when the counting information corresponds to the 1st number of times and controls the 2nd number of the memory blocks to be refreshed when the counting information corresponds to the 2nd number of times.

The refresh counting unit may be initialized when the target refresh signal is disabled.

In accordance with another embodiment of the present invention, a memory device includes: a plurality of memory blocks; a mode setting block suitable for setting a 1st mode or a 2nd mode for refreshing a 1st number of the memory blocks or a 2nd number of the memory blocks which is smaller than the 1st number of the memory blocks, respectively, at one time under a control of a memory controller; and a refresh control block suitable for controlling the 1st number of the memory blocks to be refreshed when a refresh command is inputted while the 2nd mode is set by the mode setting block, wherein the refresh control block controls a word line corresponding to a counting address which is changed when the memory blocks are refreshed to be refreshed and controls a word line corresponding to a target address which is an address of a word line requiring an additional refresh operation to be refreshed during a target refresh operation.

The refresh control block may control each of the memory blocks to be target-refreshed once during a time corresponding to N times as long as a 1st period when a 1st predetermined number of times that each of the memory blocks is target-refreshed during the 1st period where the refresh command is inputted in the 1st mode is set to 1/N.

The mode setting block may set a 3rd mode for refreshing a 3rd number of the memory blocks which is smaller than the 2nd number of the memory blocks at one time, and the refresh control block may control the 1st number of the memory blocks to be refreshed when the refresh command is inputted as much as a 1st number of times and may control the 2nd number of the memory blocks to be refreshed when the refresh command is inputted as much as a 2nd number of times while the 3rd mode is set by the mode setting block.

The refresh command may be inputted at the 1st period in the 1st mode, and the refresh command is inputted at a 2nd period which is shorter than the 1st period in the 2nd mode, and the refresh command is inputted at a 3rd period which is shorter than the 2nd period in the 3rd mode.

The refresh control block may increase the number of the 1st number of times as the 1st predetermined number of times increases and the number of the 2nd number of times as the 1st predetermined number of times decreases.

The refresh control block may control the target refresh operation not to be performed when the 1st predetermined number of times is set to 0 In the 3rd mode, and may control the 2nd number of the memory blocks to be refreshed when the refresh command is inputted.

The target address may be of a word line whose data retention time is shorter than data retention times of other word lines.

The target address may be of a word line adjacent to a word line whose active number of times is over a reference number of times, or active frequency is over a reference frequency, or active time is over a reference time.

The refresh control block may include: a refresh counting unit suitable for counting the number of times that the refresh command is inputted and generating counting information; a 1st refresh control unit suitable for controlling the word line corresponding to the counting address to be refreshed in response to the refresh command; and a 2nd refresh control unit suitable for generating a target refresh signal corresponding to a target refresh section when the counting information corresponds to a 3rd number of times which is the same as the 1st number of times or the 2nd number of times and controlling the word lines corresponding to the target address to be refreshed in response to the refresh command, wherein the 1st and 2nd refresh control units control the 1st number of the memory blocks to be refreshed when the counting information corresponds to the 1st number of times and control the 2nd number of the memory blocks to be refreshed when the counting information corresponds to the 2nd number of times.

The refresh counting unit may be initialized when the target refresh signal is disabled.

The 1st number may be the same as the number of the memory blocks, and the 2nd number may be the same as half of the number of the memory blocks, and the 3rd number is the same as a quarter of the number of the memory blocks, and the 2nd period is the same as half of the 1st period, and the 3rd period is the same as half of the 2nd period.

In accordance with another embodiment of the present invention, a memory system includes: a memory device including a plurality of memory blocks, wherein the memory device is set to a 1st mode or a 2nd mode for refreshing a 1st number of the memory blocks or a 2nd number of the memory blocks which is smaller than the 1st number of the memory blocks, respectively, at one time based on Inputted setting information and refreshes the 1st number of the memory blocks when a refresh command is inputted while the 2nd mode is set and refreshes a word line corresponding to a counting address which is changed when the memory blocks are refreshed and refreshes a word line corresponding to a target address which is an address of a word line requiring an additional refresh operation during a target refresh operation; and a memory controller that inputs the setting information to the memory device and inputs the refresh command at a 1st period when the memory device is set to the 1st mode and inputs the refresh command at a 2nd period which is shorter than the 1st period when the memory device is set to the 2nd mode.

The memory device may control each of the memory blocks to be target-refreshed once during a time corresponding to N times as long as a 1st period when a 1st predetermined number of times that each of the memory blocks is target-refreshed during the 1st period where the refresh command is inputted in the 1st mode is set to 1/N.

The memory device may set a 3rd mode for refreshing a 3rd number of the memory blocks which is smaller than the 2nd number of the memory blocks at one time, and refresh the 1st number of the memory blocks when the refresh command is inputted as much as a 1st number of times and the 2nd number of the memory blocks when the refresh command is inputted as much as a 2nd number of times while the 3rd mode is set by the mode setting block.

The memory controller may input the refresh command at a 3rd period which is shorter than the 2nd period when the memory device is set to the 3rd mode.

The memory device may increase the number of the 1st number of times as the 1st predetermined number of times increases and the number of the 2nd number of times as the 1st predetermined number of times decreases.

BRIEF DESCRIPTION OF THE DRAWINGS

FIGS. 8A to 8I are timing diagrams illustrating a refresh operation of the semiconductor device shown in FIG. 7.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

Figure 2:
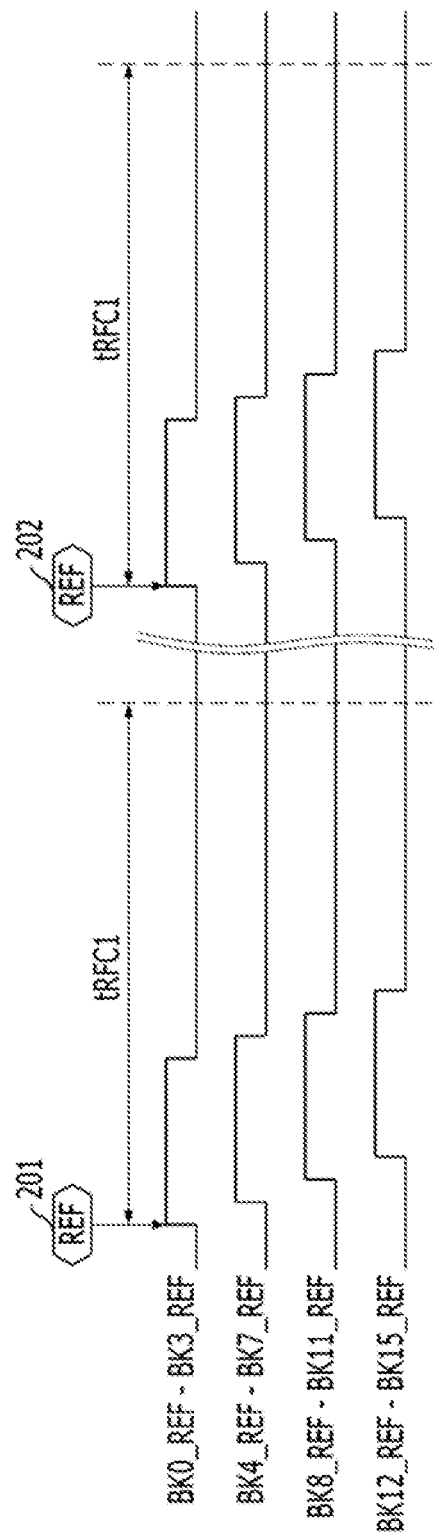
FIGS. 2 to 4 are timing diagrams illustrating a refresh operation of a semiconductor device corresponding to each of refresh modes.
Figure 3:
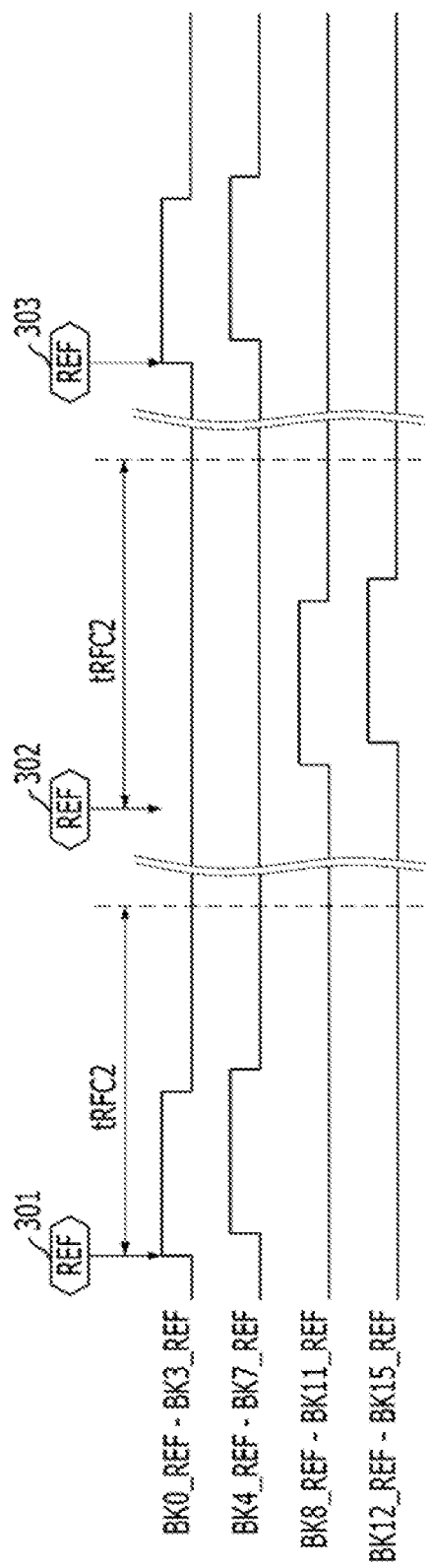
Figure 4:
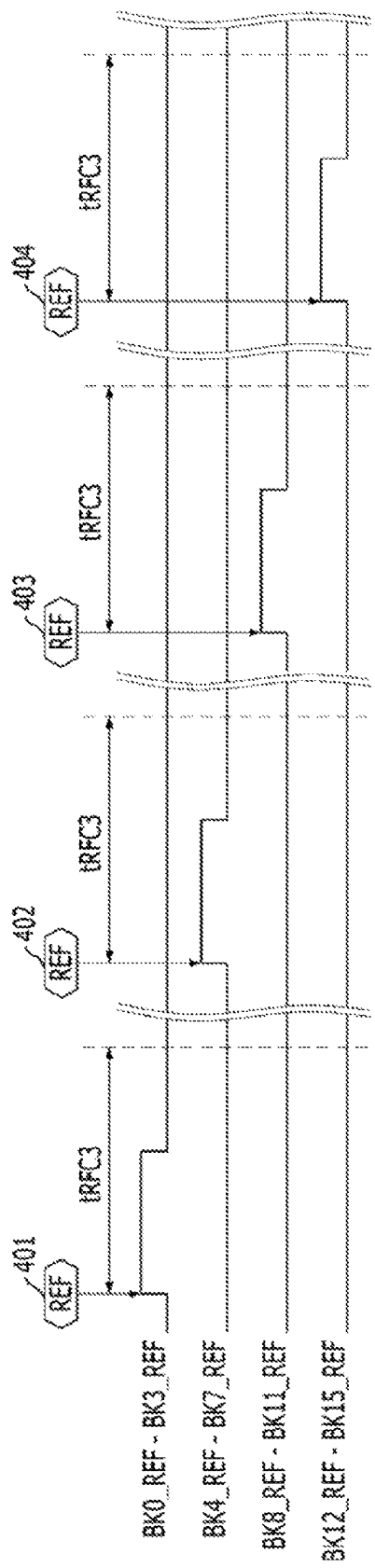

FIGS. 2 to 4 are timing diagrams illustrating a refresh operation of a semiconductor device corresponding to each of refresh modes.

FIG. 2 illustrates a refresh operation of the memory device when a refresh mode is set to a 1st mode. The 1st mode may be the Fine Granularity Refresh (FGR) 1 mode. Whenever a refresh command is inputted to the memory device in the 1st mode, one word line may be refreshed in each memory bank.

Referring to FIG. 2, a plurality of memory banks BK0 to BK15 are refreshed in response to each of refresh commands 201 and 202. In the drawing, enablement of plural refresh signals BK0_REF to BK15_REF may represent refresh operations on the plurality of memory banks BK0 to BK15, respectively.

When the refresh commands 201 and 202 are sequentially inputted, word lines in each of the plurality of memory banks BK0 to BK15 are sequentially refreshed. For example, when a $100^{th}$ word line in each of the plurality of memory banks BK0 to BK15 is refreshed in response to the previous refresh command 201, a $101^{st}$ row in each of the plurality of memory banks BK0 to BK15 may be refreshed when the following refresh command 202 is inputted. Since all of the plurality of memory banks BK0 to BK15 are refreshed in response to the single refresh command in the 1st mode, a refresh operation section, i.e., a refresh cycle tRFC1 of the 1st mode is set relatively long.

The plurality of memory banks BK0 to BK15 may be divided into plural groups of memory banks, for example, a 1st memory bank group BK0_REF to BK3_REF, a 2nd memory bank group BK4_REF to BK7_REF, a 3rd memory bank group BK8_REF to BK111_REF and a 4th memory bank group BK12_REF to BK15_REF. Each of the plural memory bank groups BK0_REF to BK3_REF, BK4_REF to BK7_REF, BK8_REF to BK111_REF and BK12_REF to BK15_REF is individually enabled with a slight timing difference to reduce peak current caused by the refresh operation. Such a refresh scheme is referred to as a piled refresh scheme, and the refresh scheme shown in FIG. 2 is referred to as a four-piled refresh scheme since the plurality of memory banks BK0 to BK15 are divided into four memory bank groups, each of which is the unit of the activation for the refresh operation, and thus all of the plurality of memory banks BK0 to BK15 is refreshed with four activations. The unit of activation of memory banks may be changed and thus all of the plurality of memory banks BK0 to BK15 may be refreshed with eight activations (an eight-piled refresh scheme).

FIG. 3 illustrates a refresh operation of the memory device when the refresh mode is set to a 2nd mode. The 2nd mode may be the FGR2 mode. Whenever a refresh command is inputted to the memory device in the 2nd mode, one single word line may be refreshed in each of a half of the plurality of memory banks BK0 to BK15.

Referring to FIG. 3, a 1st half BK0 to BK7 of the plurality of memory banks BK0 to BK15 are refreshed in response to an input of a 1st refresh command 301, and a 2nd half BK8 to BK15 of the plurality of memory banks BK0 to BK15 are refreshed in response to an input of a 2nd refresh command 302. When a 3rd refresh command 303 coming next to the 2nd refresh command 302 is inputted, the 1st half BK0 to BK7 of the plurality of memory banks BK0 to BK15 may be refreshed again. When the refresh commands 301 to 303 are sequentially inputted, word lines in each of the plurality of memory banks BK0 to BK15 are sequentially refreshed. Since half of the plurality of memory banks BK0 to BK15 are refreshed in response to the single refresh command in the 2nd mode, a refresh operation section, i.e., tRFC2 of the 2nd mode may be set smaller than the refresh operation section of the 1st mode (tRFC2<tRFC1).

FIG. 4 illustrates a refresh operation of the memory device when the refresh mode is set to a 3rd mode. The 3rd mode may be the FGR4 mode. Whenever a refresh command is inputted to the memory device in the 3rd mode, one word line may be refreshed in each of a quarter of the plurality of memory banks BK0 to BK15.

Referring to FIG. 4, a 1st quarter BK0 to BK3 of the plurality of memory banks BK0 to BK15 are refreshed in response to an input of a 1st refresh command 401, a 2nd quarter BK4 to BK7 of the plurality of memory banks BK0 to BK15 are refreshed in response to an input of a 2nd refresh command 402, a 3rd quarter BK8 to BK11 of the plurality of memory banks BK0 to BK15 are refreshed in response to an input of a 3rd refresh command 403, and a 4th quarter BK12 to BK15 of the plurality of memory banks BK0 to BK15 are refreshed in response to an input of a 4th refresh command 404. When a 5th refresh command next to the 4th refresh command 404 is inputted, the 1st quarter BK0 to BK3 of the plurality of memory banks BK0 to BK15 may be refreshed again. When the refresh commands 401 to 404 are sequentially inputted, word lines in each of the plurality of memory banks BK0 to BK15 are sequentially refreshed. Since a quarter of the plurality of memory banks BK0 to BK15 are refreshed in response to the single refresh command in the 3rd mode, a refresh operation section, i.e., tRFC3 of the 3rd mode may be set smaller than the refresh operation section of the 2nd mode (tRFC3<tRFC2).

Figure 5:
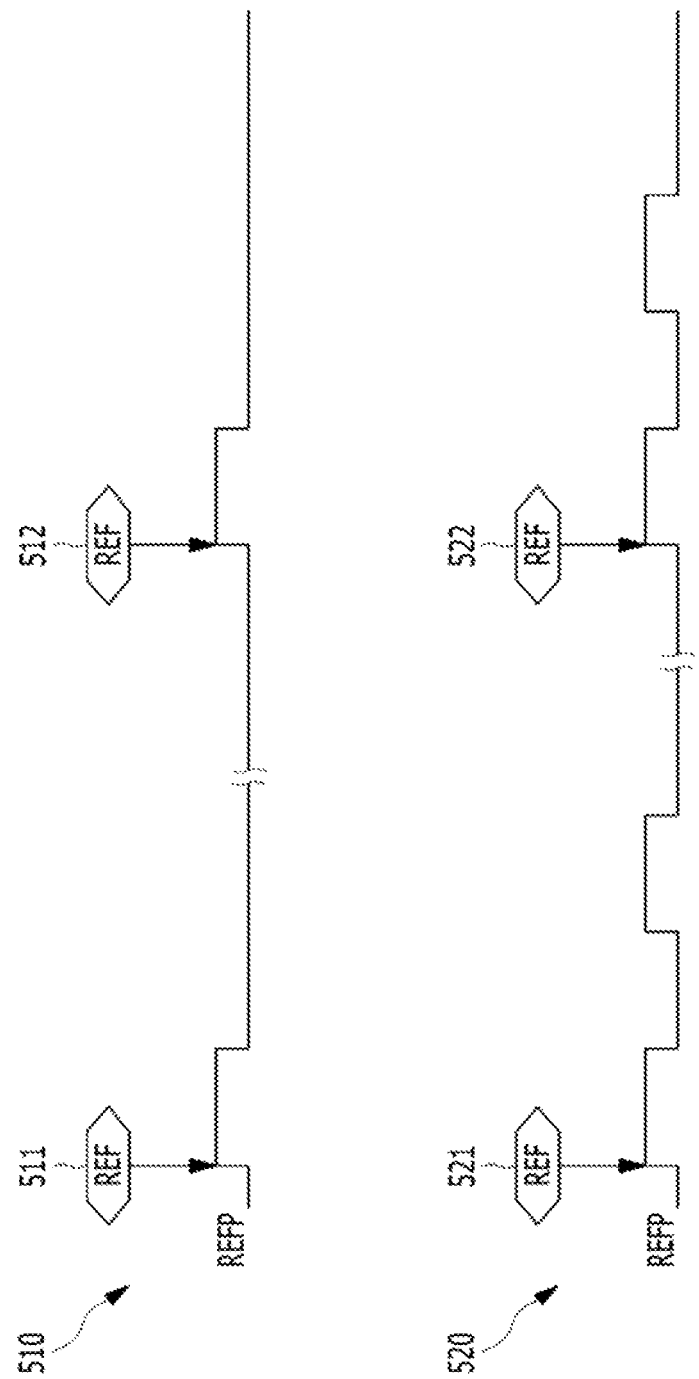
FIG. 5 is a timing diagram illustrating an Advanced Refresh (AR) operation.

FIG. 5 is a timing diagram illustrating an Advanced Refresh (AR) operation. Reference numeral 510, shown in FIG. 5, indicates a timing diagram illustrating a normal refresh operation, not the AR operation, and reference numeral 520, shown in FIG. 5, indicates a timing diagram illustrating the AR operation.

In the normal refresh operation 510, whenever a refresh command REF is inputted, the refresh operation may be performed one time. A single enablement of a signal REFP may correspond to a single refresh operation. In the AR operation 520, whenever a single refresh command REF is inputted, two or more refresh operations may be performed on average.

FIG. 5 illustrates a refresh operation performed twice whenever a refresh command REF is inputted. The signal REFP is enabled twice whenever refresh commends 521 and 522 are inputted. This represents that a refresh operation is performed twice in response to each of the refresh commands 521 and 522.

Referring to FIG. 5, during the normal refresh operation 510, a single word line in a refresh target bank is refreshed whenever the refresh command REF is inputted. During the AR operation 520, two word lines in a refresh target bank are refreshed whenever the refresh command REF is inputted. Even when memory cell data retention time decreases, the AR operation may maintain the data of the memory cell by increasing the number of refresh times or reducing the refresh interval.

Although FIG. 5 shows that the number of times that a refresh operation is performed on average is 2 when the refresh command REF is inputted once, the number of refresh times on average when the refresh command REF is inputted once may vary according to system design. For example, when the refresh operation is performed once in response to each of three inputs of the refresh command REF and performed twice in response to a 4th input of the refresh command REF, the predetermined number of refresh times per each input of the refresh command REF may be approximately 1.25, or 5/4, which means that the refresh operation is performed five times while the refresh command REF is inputted four times.

Figure 6:
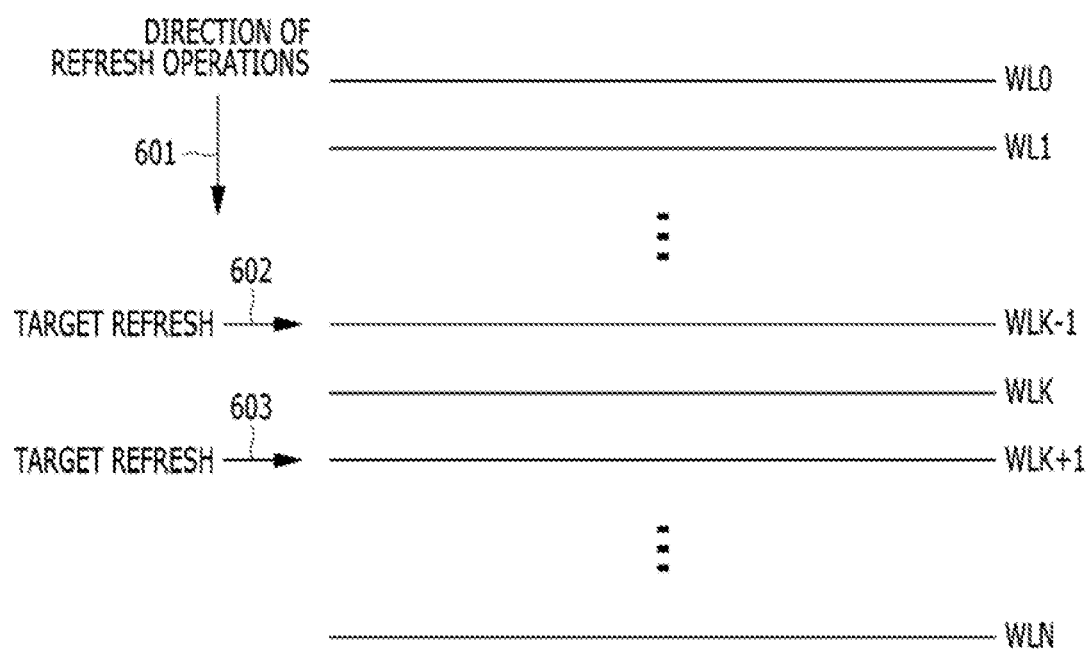
FIG. 6 is a timing diagram illustrating a Target Refresh (TR) operation.

FIG. 6 is a timing diagram illustrating a Target Refresh (TR) operation. FIG. 6 illustrates a plurality of word lines WL0 to WLN included in a bank.

Referring to FIG. 6, when the normal refresh operation which is not a target refresh operation is performed, one or more word lines are refreshed whenever a refresh command is inputted, and the plurality of word lines WL0 to WLN may be sequentially refreshed. In the drawing, the refresh operation is performed in an arrow direction 601. After the refresh operation of the word line N WLN is completed, the plurality of word lines WL0 to WLN may be sequentially refreshed again.

When a target refresh operation is performed, selected word lines may be refreshed regardless of the normal refresh operation according to a predetermined condition (refer to '602' and '603' in the drawing). The target-refreshed word lines may require an additional refresh operation because it is hard to maintain the data just through normal refresh operations. Therefore, word lines for the target refresh operation may be randomly selected as the occasion demands.

Figure 1:
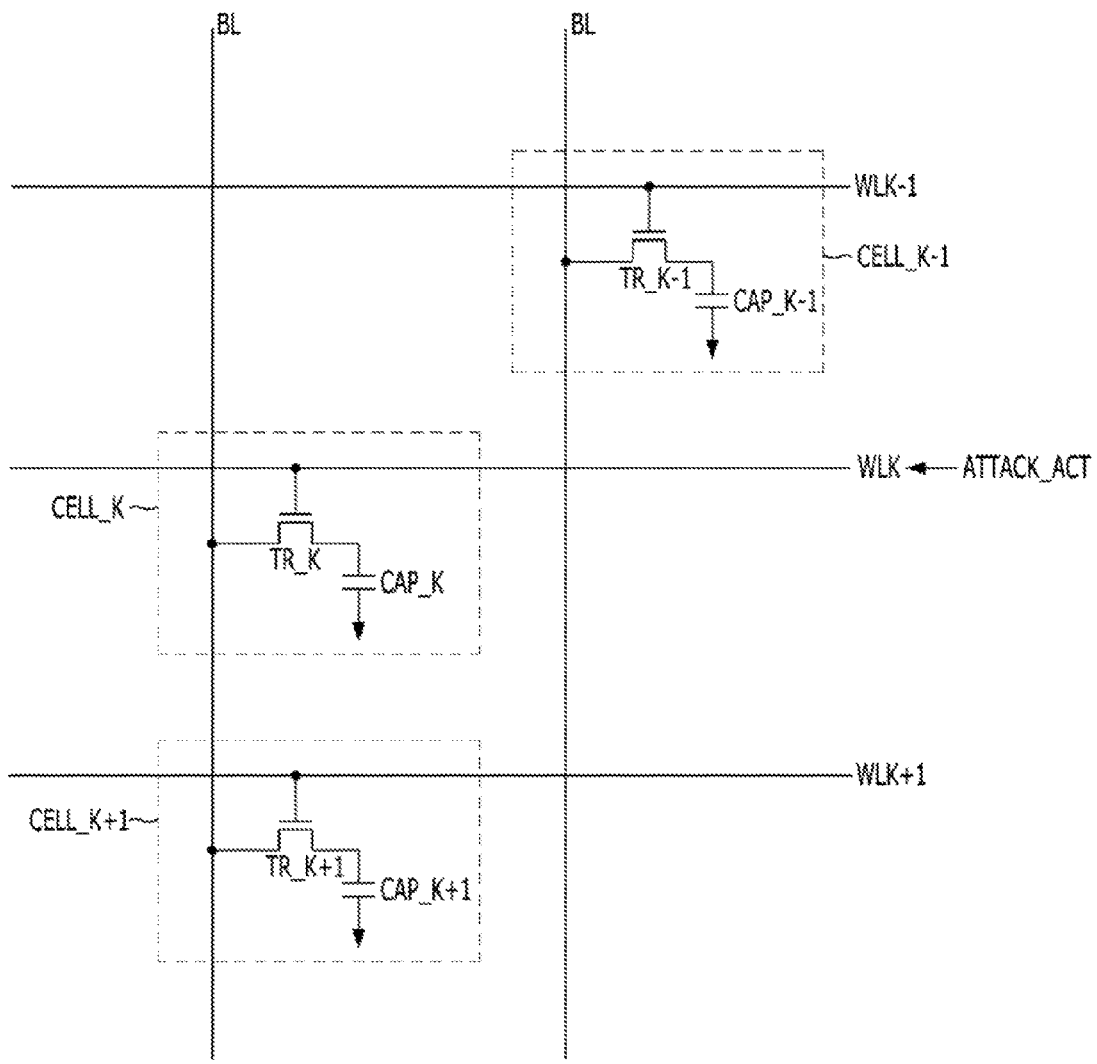
FIG. 1 is a circuit diagram illustrating a portion of a cell array included in a memory device.

When the target refresh operation is performed to solve the problems described with reference to FIG. 1, a Kth word line WLK shown in FIG. 1 may be detected according to a predetermined condition, and a target address may be generated based on the detection result, and the target refresh operation may be performed on a (K−1)th word line WLK−1 and a (K+1)th word line WLK+1 based on the target address. During the target refresh operation based on the detection of the Kth word line WLK, a pair of the refresh operations may be performed on both of the neighboring word lines WLK−1 and WLK+1, respectively.

Figure 7:
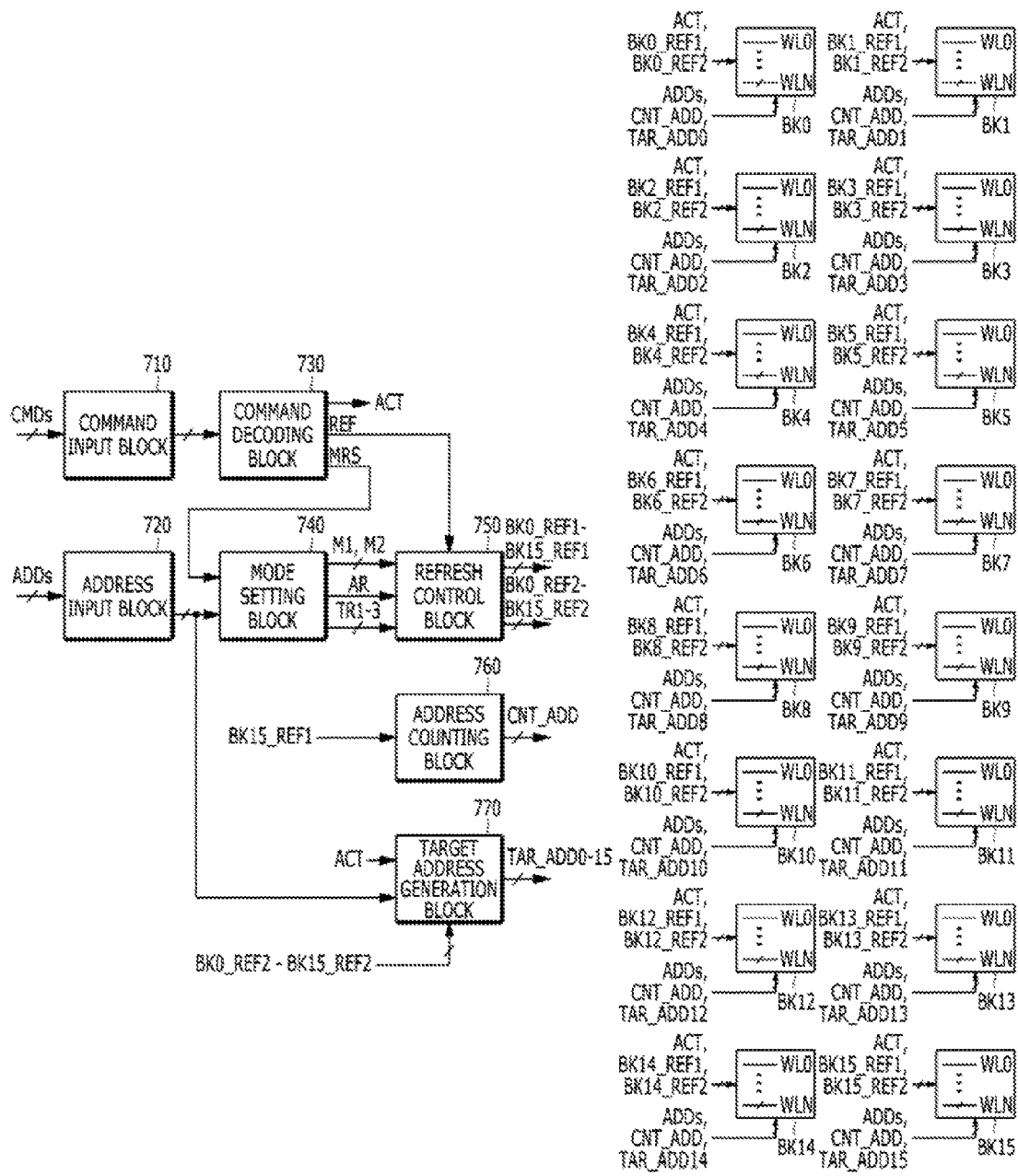
FIG. 7 is a block diagram illustrating a memory device in accordance with an embodiment of the present invention.

FIG. 7 is a block diagram illustrating a memory device in accordance with an embodiment of the present invention.

Referring to FIG. 7, the memory device may include a command input block 710, an address input block 720, a command decoding block 730, a mode setting block 740, a refresh control block 750, an address counting block 760, a target address generation block 770, and a plurality of memory banks BK0 to BK15.

The command input block 710 may receive commands CMD applied from a memory controller and the address input block 720 may receive addresses ADD applied from the memory controller. The commands CMD and the addresses ADD may individually include signals of multiple bits.

The command decoding block 730 may decode the commands CMD inputted through the command input block 710, and generate a Mode Register Set (MRS) command and a refresh command REF. When a combination of the inputted commands CMD corresponds to the MRS command, the command decoding block 730 may enable the MRS command, and when the combination of the Inputted commands CMD represents the refresh command REF, the command decoding block 730 may enable the refresh command REF. Also, when the combination of the inputted commands CMD represents an active command ACT, the command decoding block 730 may enable the active command ACT.

The mode setting block 740 may set a refresh mode based on the addresses ADD inputted through the address input block 720 when the MRS command is enabled. The refresh mode may include the 1st to 3rd modes as described above with reference to FIGS. 2 to 4. The refresh mode may be set through the mode setting block 740 by the memory controller. A signal M1 outputted from the mode setting block 740 may indicate the 1st mode, and a signal M2 may indicate the 2nd mode. Disablement of both signals M1 and M2 may indicate the 3rd mode.

In the 1st mode, a 1st number of banks among the plurality of memory banks BK0 to BK15 may be refreshed at a time. The 1st number of the banks may be the total number of the plurality of memory banks BK0 to BK15. In the 2nd mode, a 2nd number of banks among the plurality of memory banks BK0 to BK15, which is smaller than the 1st number of the banks, may be refreshed at a time. The 2nd number of the banks may be a half of the plurality of memory banks BK0 to BK15. In the 3rd mode, a 3rd number of banks among the plurality of memory banks BK0 to BK15, which is smaller than the 2nd number of the banks, may be refreshed at a time. The 3rd number of the banks may be a quarter of the plurality of memory banks BK0 to BK15. Herein, the number of the banks refreshed at a time may indicate the number of banks refreshed when the single refresh command REF is inputted in the corresponding refresh mode.

When the memory device is set to the 1st mode, the refresh command REF is inputted at a 1st period, and when the memory device is set to the 2nd mode, the refresh command REF is inputted at a 2nd period, which is shorter than the 1st period, and when the memory device is set to the 3rd mode, the refresh command REF is inputted at a 3rd period, which is shorter than the 2nd period. Herein, the 2nd period may be half of the 1st period, and the 3rd period may be half of the 2nd period, i.e., a quarter of the 1st period.

Therefore, in the 1st mode, all of the plurality of memory banks BK0 to BK15 may be refreshed once per the single refresh command REF of the 1st period. In the 2nd mode, half of the plurality of memory banks BK0 to BK15 may be refreshed once per the single refresh command REF of the 2nd period. In the 3rd mode, a quarter of the plurality of memory banks BK0 to BK15 may be refreshed once per the single refresh command REF of the 3rd period.

The mode setting block 740 may set an Advanced Refresh (AR) mode based on the addresses ADD inputted through the address input block 720 when the mode register set command MRS is enabled. In an exemplary case of the 1st mode, when the AR mode is set, a couple of refresh operations may be performed per the single refresh command REF. In other words, the refresh operation may be performed twice on all of the plurality of memory banks BK0 to BK15 at every 1st period. A signal AR may indicate the AR mode.

The mode setting block 740 may set a target refresh mode based on the addresses ADD inputted through the address input block 720 when the mode register set command MRS is enabled. In an exemplary case of the 1st mode, when the target refresh mode is set, a predetermined number of times of target refresh operations may be performed on all of the plurality of memory banks BK0 to BK15 per the single refresh command REF. For example, when a 1st target refresh mode is set, the target refresh operation may be performed once on all of the plurality of memory banks BK0 to BK15 per the single refresh command REF. When a 2nd target refresh mode is set, the target refresh operation may be performed 0.5 times on all of the plurality of memory banks BK0 to BK15 per the single refresh command REF. When a 3rd target refresh mode is set, the target refresh operation may be performed 0.25 times on all of the plurality of memory banks BK0 to BK15 per the single refresh command REF. Signals TR1, TR2, and TR3 may indicate the 1st to 3rd target refresh modes, respectively. When the target refresh mode is not set, the signals TR1 to TR3 may be disabled.

The 0.5 times of the refresh operation (the target refresh operation) on the plurality of memory banks BK0 to BK15 per the single refresh command REF may mean a single refresh operation (the target refresh operation) on half of the plurality of memory banks BK0 to BK15 per the single refresh command REF. Also, the 0.25 times of the refresh operation (the target refresh operation) on the plurality of memory banks BK0 to BK15 per the single refresh command REF may mean a single refresh operation (the target refresh operation) on a quarter of the plurality of memory banks BK0 to BK15 per the single refresh command REF.

The refresh control block 750 controls the refresh operation of the memory in response to the modes M1, M2, AR and TR1 to TR3 and the refresh command REF set by the mode setting block 740. The refresh operation is controlled based on enablement of normal and target bank refresh signals BK0_REF1 to BK15_REF1 and BK0_REF2 to BK15_REF2 for the plurality of memory banks BK0 to BK15. The normal bank refresh signals BK0_REF1 to BK15_REF1 may control the normal refresh operation of the plurality of memory banks BK0 to BK15, respectively, and the target bank refresh signals BK0_REF2 to BK15_REF2 may control the target refresh operation of the plurality of memory banks BK0 to BK15, respectively.

The address counting block 760 may generate a counting address CNT_ADD for the normal refresh operation through a counting operation. The address counting block 760 may increase a value of the counting address CNT_ADD by 1 whenever the refresh operation on all of the plurality of memory banks BK0 to BK15 is completed. For this, the address counting block 760 may change the counting address CNT_ADD whenever the refresh operation on the last one, e.g., BK15, of the plurality of memory banks BK0 to BK15 is completed. Through the increase of the value of the counting address CNT_ADD by 1, a $(K+1)^{th}$ word line is selected for the next normal refresh operation when a $K^{th}$ word line is selected for the current normal refresh operation.

The target address generation block 770 may generate target addresses TAR_ADD0 to TAR_ADD15 for the target refresh operation. The target addresses TAR_ADD0 to TAR_ADD15 may correspond to word lines in need of the target refresh operation due to the aforementioned internal or external factors.

For example, an address of a word line coupled with memory cells, whose data retention time is shorter than other memory cells due to defects, may be stored in the target address generation block 770 in advance. Subsequently, the stored address of the word line may be outputted as the target addresses TAR_ADD0 to TAR_ADD15 during the target refresh operation. The target address generation block 770 may detect and store an address of a word line whose active number of times is large, whose active frequency is high, or whose active time is long, and output an address corresponding to a word line adjacent to the word line (the active word line) as the target addresses TAR_ADD0 to TAR_ADD15 during the target refresh operation. The target address generation block 770 may generate and output addresses of a $(K-1)^{th}$ word line and the $(K+1)^{th}$ word line as the target addresses TAR_ADD0 to TAR_ADD15 when the detected and stored address is an address of the Km word line.

When one or more among the target bank refresh signals BK0_REF2 to BK15_REF2 are enabled, the target address generation block 770 may output a target address of the bank corresponding to the enabled target bank refresh signals. As described above, during the target refresh operation based on the detection of the Kth word line WLK, the pair of refresh operations may be performed on both of the neighboring word lines WLK−1 and WLK+1, respectively. The target address generation block 770 may firstly output the address of the $(K-1)^{th}$ word line when the target bank refresh signals BK0_REF2 to BK15_REF2 are firstly enabled, and secondly output the address of the $(K+1)^{th}$ word line when the target bank refresh signals BK0_REF2 to BK15_REF2 are secondly enabled.

The target address generation block 770 may store an active number of times, an active history, or an active time of each word line of each bank, compare the same with reference information which is a reference number of times, a reference frequency, or a reference time, and store addresses ADD of a word line whose active number of times is larger than the reference number of times, or active frequency is higher than the reference frequency, or active time is longer than the reference time. For this, the target address generation block 770 may receive the active command ACT and addresses ADD and use them for word line detection.

Herein, the active history may be information related to details of the active word line based on a sequential input of the active command ACT. For example, the active history may be information indicating a word line of a bank enabled during 1st to $N^{th}$ active operations. The active frequency may correspond to the number of times that a predetermined word line of a predetermined bank is enabled during an active operation of a predetermined number of times. For example, it is assumed that the active history of a bank X is shown in following Table 1.

TABLE 1

| | Active degree | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Active word line number | 7 | 1 | 5 | 34 | 7 | 56 | 23 | 12 | 7 | 7 | 43 | 53 |

As shown above, it may be seen that a 7th word line is enabled once every three active operations (1-3, 4-6, 7-9 and 10-12). The active frequency of the 7th word line may be once per the three active operations.

The target address generation block 770 is not limited to the described embodiments. The target address generation block 770 may store addresses of a word line satisfying a condition influencing data of a memory cell coupled with neighboring word lines related to an active operation and generate addresses of word lines adjacent to the word line as a target address.

Each of the plurality of memory banks BK0 to BK15 may include a plurality of word lines WL0 to WLN coupled with a plurality of memory cells (not shown). When the normal bank refresh signals BK0_REF1 to BK15_REF1 are enabled, the plurality of memory banks BK0 to BK15 may refresh word lines corresponding to the counting address CNT_ADD, and when the target bank refresh signals BK0_REF2-BK15_REF2 are enabled, the plurality of memory banks BK0 to BK15 may refresh word lines corresponding to the target addresses TAR_ADD0 to TAR_ADD15.

Hereafter, a mode setting and a refresh operation of the semiconductor device based on the mode setting are described with reference to FIGS. 8A to 8I.

FIGS. 8A to 8I illustrate the refresh operation of the semiconductor device shown in FIG. 7.

As described with reference to FIG. 7, the memory device may be set to one among the 1st to 3rd modes, and it may be set or may not be set to the AR mode, and it may be set or may not be set to one among the 1st to 3rd target refresh modes. Hereafter, the refresh operation of the memory device is described giving examples of some operation modes.

In the target refresh operation, it is described below that the aforementioned two word lines, which are the $(K-1)^{th}$ word line and the $(K+1)^{th}$ word line, are refreshed when the $K^{th}$ word line is detected. The drawings may show that the normal refresh operation is performed on a corresponding bank when the normal bank refresh signals BK0_REF1 to BK15_REF1 are enabled, and the target refresh operation is performed on a corresponding bank when the target bank refresh signals BK0_REF2-BK15_REF2 are enabled.

FIG. 8A illustrates a refresh operation of the memory device, which is set to the 1st mode and not set to the AR mode or the target refresh mode.

Whenever each of refresh commands 801 and 802 is inputted with the 1st period T1, the normal refresh operation may be performed once on all of the plurality of memory banks BK0 to BK15.

FIG. 8B illustrates a refresh operation of the memory device, which is set to the 1st mode and the AR mode and not set to the target refresh mode.

Whenever each of the refresh commands 801 and 802 is inputted with the 1st period T1, the normal refresh operation may be performed twice on all of the plurality of memory banks BK0 to BK15.

FIG. 8C illustrates a refresh operation of the memory device, which is set to the 2nd mode and the AR mode and not set to the target refresh mode.

According to the conventional setting of the 2nd mode and the AR mode, the normal refresh operation is supposed to be sequentially performed twice on half BK0 to BK7 of the plurality of memory banks BK0 to BK15 during the 2nd period T2 in response to the 1st refresh command 801, and then twice on the other half BK8 to BK15 of the plurality of memory banks BK0 to BK15 during the 2nd period T2 in response to the 2nd refresh command 802.

However, in accordance with an embodiment of the present invention as shown in FIG. 8C, in the 2nd mode and the AR mode, the normal refresh operation is sequentially performed once on all of the plurality of memory banks BK0 to BK15 whenever each of the refresh commands 801 and 802 are inputted with the 2nd period T2.

The number of memory banks subject to the normal refresh operations per the single refresh command in the 2nd mode and the AR mode shown in FIG. 8C is the same as the 1st mode described with reference to FIG. 2 except for the periods T1 and T2 of the refresh command.

Here, it is defined in the description that the 1st mode is a higher mode to the 2nd mode, and the 2nd mode is a lower mode to the 1st mode. Similarly, it is defined in the description that the 2nd mode is the higher mode to the 3rd mode, and the 3rd mode is the lower mode to the 2nd mode.

Despite of the difference in the number of memory banks subject to the normal refresh operations per the single refresh command on the plurality of memory banks BK0 to BK15 during the 2nd period T2 between the conventional setting and the embodiment of the present invention, the total number of normal refresh operations on all of the plurality of memory banks BK0 to BK15 during the 1st period T1, which is twice the 2nd period T2, between the conventional setting and the embodiment of the present invention is the same as each other by making the number of memory banks subject to the normal refresh operations per the single refresh command in the 2nd mode and the AR mode the same as the 1st mode.

As described above, in accordance with an embodiment of the present invention, the normal refresh operations in the lower mode and the AR mode may be performed by making the number of memory banks subject to normal refresh operations per the single refresh command the same as the higher mode.

Figure 8D:
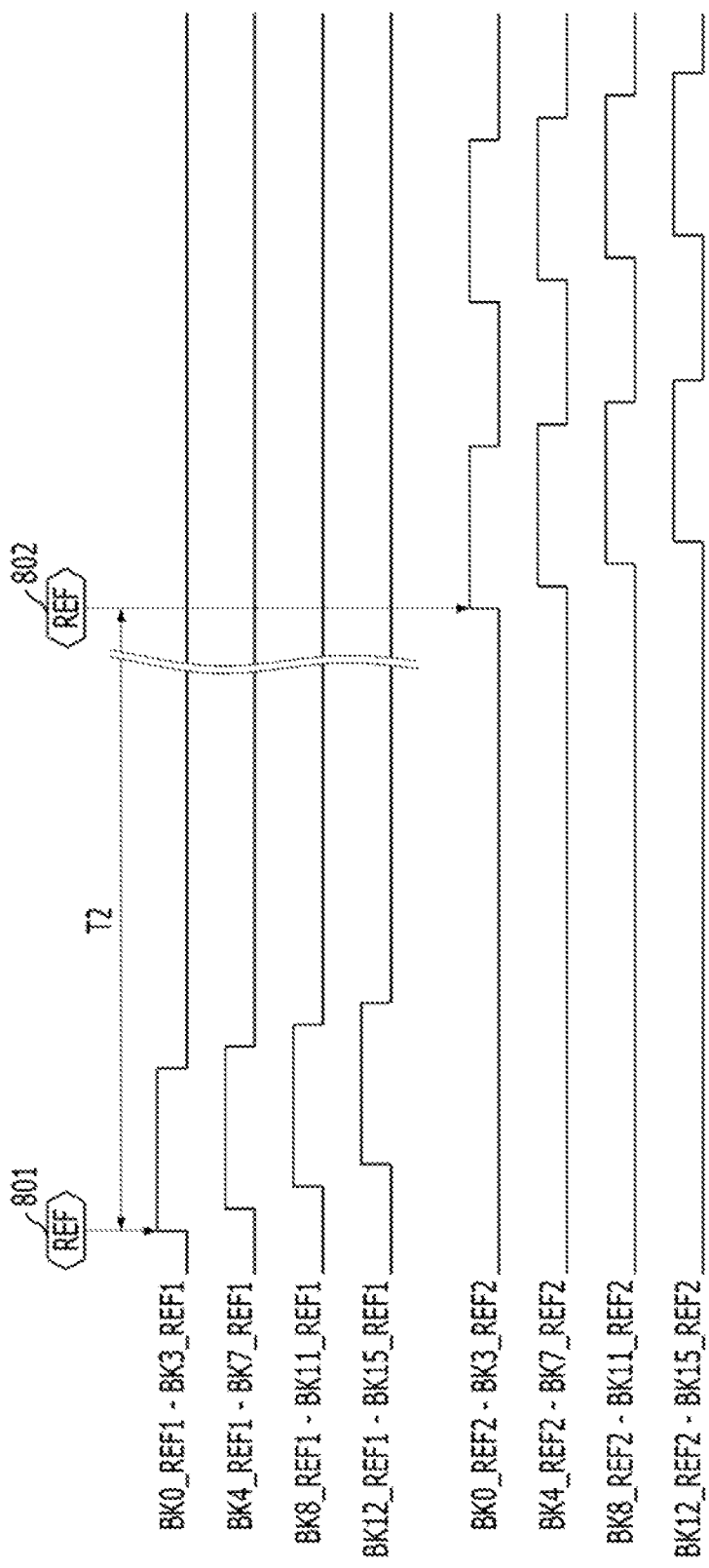

FIG. 8D illustrates a refresh operation of the memory device, which is set to the 2nd mode and the 1st target refresh mode and not set to the AR mode.

For the 2nd mode and the 1st target refresh mode, each of the normal refresh operation and the target refresh operation is supposed to be performed once on all of the plurality of memory banks BK0 to BK15 during the 1st period T1, which is twice the 2nd period T2.

However, as described above, during the target refresh operation, the pair of refresh operations may be performed on both of the neighboring word lines in each of the plurality of memory banks BK0 to BK15, respectively, which means that the refresh operation is supposed to be consecutively performed twice on all of the plurality of memory banks BK0 to BK15 for the target refresh operation. Therefore, according to the conventional sequence of the normal operations in the 2nd mode, described with reference to FIG. 3, the target refresh operation cannot be performed once on all of the plurality of memory banks BK0 to BK15 during the 1st period T1 in the 2nd mode.

In accordance with an embodiment of the present invention, the target refresh operation may be performed once on all of the plurality of memory banks BK0 to BK15 during the 1st period T1 in the 2nd mode by making the number of memory banks subject to the normal refresh operations per the single refresh command in the lower mode or the 2nd mode the same as the higher mode or the 1st mode.

Referring to FIG. 8D, in the 2nd mode and the 1st target refresh mode, the normal refresh operation is sequentially performed once on all of the plurality of memory banks BK0 to BK15 in response to the 1st refresh commands 801 of the 2nd period T2. The number of memory banks subject to the normal refresh operations per the single refresh command in response to the 1st refresh command 801 in the 2nd mode and the 1st target refresh mode shown in FIG. 8D is the same as the 1st mode described with reference to FIG. 2, except for the periods T1 and T2 of the refresh command.

Then, the 1st target refresh operation may be sequentially performed once on the plurality of memory banks BK0 to BK15 in response to the 2nd refresh commands 802 of the 2nd period T2. For example, the word lines detected from each of the plurality of memory banks BK0 to BK15 are K0th to K15th word lines, respectively, the 1st target refresh operation may be sequentially performed on the neighboring K(0−1)th and K(0+1)th word lines to K(15−1)th and K(15+1)th word lines in each of the plurality of memory banks BK0 to BK15 in response to the 2nd refresh commands 802 of the 2nd period T2.

In the 1st target refresh mode, the refresh operation is supposed to be consecutively performed twice on all of the plurality of memory banks BK0 to BK15 during the 1st period T1, as shown in FIG. 8D.

As described above, in accordance with an embodiment of the present invention, the normal refresh operations in the lower mode and the target refresh mode may be performed by making the number of memory banks subject to the normal refresh operations per the single refresh command the same as the higher mode.

FIG. 8E illustrates a refresh operation of the memory device, which is set to the 3rd mode and the AR mode and not set to the target refresh mode.

According to the conventional setting of the 3rd mode and the AR mode, the normal refresh operation is supposed to be sequentially performed twice on the 1st quarter BK0 to BK3 of the plurality of memory banks BK0 to BK15 during the 3rd period T3 in response to the 1st refresh command 801, then twice on the 2nd quarter BK4 to BK7 of the plurality of memory banks BK0 to BK15 during the 3rd period T3 in response to the 2nd refresh command 802, then twice on the 3rd quarter BK8 to BK11 of the plurality of memory banks BK0 to BK15 during the 3rd period T3 in response to the 2nd refresh command 803, and then twice on the 4th quarter BK12 to BK15 of the plurality of memory banks BK0 to BK15 during the 3rd period T3 in response to the 2nd refresh command 804.

However, in accordance with an embodiment of the present invention as shown in FIG. 8E, in the 3rd mode and the AR mode, the normal refresh operation may be sequentially performed once on half BK0 to BK7 of the plurality of memory banks BK0 to BK15 during the 3rd period T3 in response to the 1st refresh command 801, and then once on the other half BK8 to BK15 of the plurality of memory banks BK0 to BK15 during the 3rd period T3 in response to the 2nd refresh command 802. Further, the normal refresh operation may be sequentially performed once on half BK0 to BK7 of the plurality of memory banks BK0 to BK15 during the 3rd period T3 in response to the 1st refresh command 803, and then once on the other half BK8 to BK15 of the plurality of memory banks BK0 to BK15 during the 3rd period T3 In response to the 2nd refresh command 804.

The number of memory banks subject to the normal refresh operations per the single refresh command in the 3rd mode and the AR mode shown in FIG. 8E is the same as the 2nd mode described with reference to FIG. 3 except for the periods T2 and T3 of the refresh command.

Despite the difference in the number of memory banks subject to the normal refresh operations per the single refresh command during the 3rd period T3 between the conventional setting and the embodiment of the present invention, the total number normal refresh operations on all of the plurality of memory banks BK0 to BK15 during the 1st period T1, which is four times the 3rd period T3, between the conventional setting and the embodiment of the present invention is the same as each other by making the number of memory banks subject to the normal refresh operations per the single refresh command in the 3rd mode and the AR mode the same as the 2nd mode.

As described above, in accordance with an embodiment of the present invention, the normal refresh operations in the lower mode (the 3rd mode) and the AR mode may be performed by making the number of memory banks subject to the normal refresh operations per the single refresh command the same as the higher mode (the 2nd mode).

FIG. 8F illustrates a refresh operation of the memory device, which is set to the 3rd mode, the AR mode, and the 1st target refresh mode.

For the 3rd mode, the AR mode and the 1st target refresh mode, during the 1st period T1, which is four times the 3rd period T3, the normal refresh operation is supposed to be performed twice on all of the plurality of memory banks BK0 to BK15 and the target refresh operation is supposed to be performed once on all of the plurality of memory banks BK0 to BK15. When the AR mode and the target refresh mode is set in the 3rd mode, the sequence of the normal operations of the 1st and 2nd modes, which are the higher modes of the 3rd mode, may be used.

Referring to FIG. 8F, the refresh commands 801 to 804 are inputted with the 3rd period T3. When the 1st refresh command 801 is inputted, the normal refresh operation is sequentially performed on the plurality of memory banks BK0 to BK15, and when the 2nd refresh command 802 is inputted, the normal refresh operation is sequentially performed on the plurality of memory banks BK0 to BK15, and when the 3rd refresh command 803 is inputted, the target refresh operation is sequentially performed on half BK0 to BK7 of the plurality of memory banks BK0 to BK15, and when the 4th refresh command 804 is inputted, the target refresh operation is sequentially performed on the other half BK8 to BK15 of the plurality of memory banks BK0 to BK15. Subsequently, when the refresh command is inputted, the aforementioned operation may be repeated.

In other words, the refresh operation may be sequentially performed twice on the plurality of memory banks BK0 to BK15 during two periods in response to the 1st and 2nd refresh commands 801 and 802, which is the same as the 1st mode except for the 1st and 3rd periods T1 and T3. Also, the refresh operation may be sequentially performed on each of the halves BK0 to BK7 and BK8 to BK15 of the plurality of memory banks BK0 to BK15 during a single period in response to each of the 3rd and 4th refresh commands 803 and 804, which is the same as the 2nd mode except for the 2nd and 3rd periods T2 and T3.

Consequently, the refresh operations shown in FIG. 8F may satisfy two times of the normal refresh operations on all of the plurality of memory banks BK0 to BK15 and a single time of the target refresh operation on all of the plurality of memory banks BK0 to BK15 during the 1st period T1, which is required in the 3rd mode, the AR mode and the 1st target refresh mode.

FIG. 8G illustrates a refresh operation of the memory device, which is set to the 3rd mode, the AR mode, and the 2nd target refresh mode.

For the 3rd mode, the AR mode and the 2nd target refresh mode, during twice of the 1st period T1 (2*T1), which is eight times the 3rd period T3, the normal refresh operation is supposed to be performed four times on all of the plurality of memory banks BK0 to BK15 and the target refresh operation is supposed to be performed once on all of the plurality of memory banks BK0 to BK15. When the AR mode and the target refresh mode is set in the 3rd mode, the sequence of the normal operations of the 1st and 2nd modes, which are the higher modes of the 3rd mode, may be used.

Referring to FIG. 8G, refresh commands 801 to 808 are inputted with the 3rd period T3. When the 1st refresh command 801 is inputted, the normal refresh operation may be sequentially performed on the plurality of memory banks BK0 to BK15, and when the 2nd refresh command 802 is inputted, the normal refresh operation may be sequentially performed on the plurality of memory banks BK0 to BK15.

When the 3rd refresh command 803 is inputted, the normal refresh operation may be sequentially performed on half BK0 to BK7 of the plurality of memory banks BK0 to BK15, and when the 4th refresh command 804 is inputted, the normal refresh operation may be sequentially performed on the other half BK8 to BK15 of the plurality of memory banks BK0 to BK15. Further, when the 5th refresh command 805 is inputted, the normal refresh operation may be sequentially performed on half BK0 to BK7 of the plurality of memory banks BK0 to BK15, and when the 6th refresh command 806 is inputted, the normal refresh operation may be sequentially performed on the other half BK8 to BK15 of the plurality of memory banks BK0 to BK15.

When the 7th refresh command 807 is inputted, the target refresh operation may be sequentially performed on half BK0 to BK7 of the plurality of memory banks BK0 to BK15, and when the 8th refresh command 808 is inputted, the target refresh operation may be sequentially performed on the other half BK8 to BK15 of the plurality of memory banks BK0 to BK15.

In other words, the refresh operation may be sequentially performed twice on the plurality of memory banks BK0 to BK15 BK0 to BK15 during two periods in response to the 1st and 2nd refresh commands 801 and 802, which is the same as the 1st mode except for the 1st and 3rd periods T1 and T3. Also, the refresh operation may be sequentially performed on each of the halves BK0 to BK7 and BK8 to BK15 of the plurality of memory banks BK0 to BK15 during a single period in response to each of the 3rd to 8th refresh commands 803 to 808, which is the same as the 2nd mode except for the 2nd and 3rd periods T2 and T3.

Consequently, the refresh operations shown in FIG. 8G may satisfy four times of the normal refresh operations on all of the plurality of memory banks BK0 to BK15 and a single time of the target refresh operation on all of the plurality of memory banks BK0 to BK15 during twice of the 1st period T1 (2*T1), which is required in the 3rd mode, the AR mode and the 2nd target refresh mode.

Figure 8I:
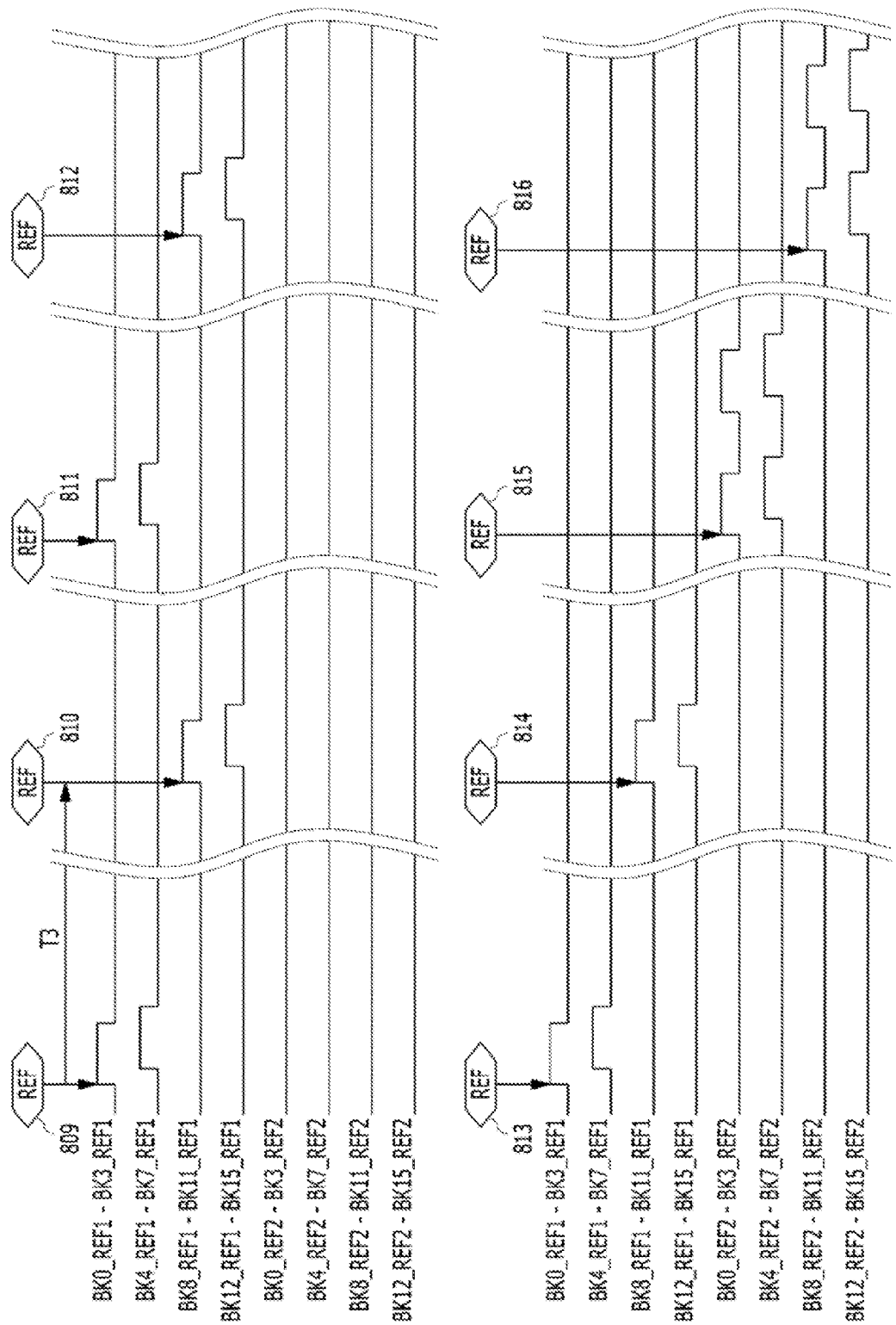

FIGS. 8H and 8I illustrate a refresh operation of the memory device, which is set to the 3rd mode, the AR mode, and the 3rd target refresh mode. FIG. 8H illustrates the refresh operation of the memory device in response to 1st to 8th refresh commands 801 to 808, and FIG. 8I illustrates the refresh operation of the memory device in response to 9th to 16th refresh commands 809 to 816.

For the 3rd mode, the AR mode and the 3rd target refresh mode, during four times of the 1st period T1 (4*T1), which is 16 times the 3rd period T3, the normal refresh operation is supposed to be performed eight times on all of the plurality of memory banks BK0 to BK15 and the target refresh operation is supposed to be performed once on all of the plurality of memory banks BK0 to BK15. When the AR mode and the target refresh mode is set in the 3rd mode, the sequence of the normal operations of the 1st and 2nd modes, which are the higher modes of the 3rd mode, may be used.

Referring to FIGS. 8H and 8I, the $1^{st}$ to $16^{th}$ refresh commands 801 to 816 are inputted with the 3rd period T3. When the $1^{st}$ refresh command 801 is inputted, the normal refresh operation may be sequentially performed on the plurality of memory banks BK0 to BK15 BK0 to BK15, and when the $2^{nd}$ refresh command 802 is inputted, the normal refresh operation may be sequentially performed on the plurality of memory banks BK0 to BK15 BK0 to BK15.

When the $3^{rd}$ refresh command 803 is inputted, the normal refresh operation may be sequentially performed on half BK0 to BK7 of the plurality of memory banks BK0 to BK15, and when the $4^{th}$ refresh command 804 is inputted, the normal refresh operation may be sequentially performed on the other half BK8 to BK15 of the plurality of memory banks BK0 to BK15. Similarly, the normal refresh operation may be sequentially performed on each of the halves BK0 to BK7 and BK8 to BK15 of the plurality of memory banks BK0 to BK15 in response to each of the $5^{th}$ to $14^{th}$ refresh commands 805 to 814.

The target refresh operation may be sequentially performed on half BK0 to BK7 of the plurality of memory banks BK0 to BK15 in response to the $15^{th}$ refresh command 815, and on the other half BK8 to BK15 of the plurality of memory banks BK0 to BK15 in response to the $16^{th}$ refresh command 816.

In other words, the refresh operation may be sequentially performed twice on the plurality of memory banks BK0 to BK15 BK0 to BK15 during two periods in response to the $1^{st}$ and $2^{nd}$ refresh commands 801 and 802, which is the same as the 1st mode except for the 1st and 3rd periods T1 and T3. Also, the refresh operation may be sequentially performed on each of the halves BK0 to BK7 and BK8 to BK15 of the plurality of memory banks BK0 to BK15 during a single period in response to each of the $3^{rd}$ to $16^{th}$ refresh commands 803 to 808, which is the same as the 2nd mode except for the 2nd and 3rd periods T2 and T3.

Consequently, the refresh operations shown in FIGS. 8H and 8I may satisfy eight times of the normal refresh operations on all of the plurality of memory banks BK0 to BK15 and a single time of the target refresh operation on all of the plurality of memory banks BK0 to BK15 during four times of the 1st period T1 (4*T1), which is required in the 3rd mode, the AR mode and the 3rd target refresh mode.

As illustrated in FIGS. 8A to 8H, the memory device shown in FIG. 7 may be set to the 2nd or 3rd mode, and when one or more modes among the advanced mode and the target refresh mode are set, the refresh operation satisfying all the predetermined modes may be performed based on the higher mode. Particularly, referring to FIGS. 8F to 8H, when the memory device is set to the 3rd mode, an operation of the advanced mode and the target refresh mode may be covered by flexibly using an operation of the 1st mode and the 2nd mode.

When the refresh command is inputted a predetermined 1st number of input times, the memory device may perform the refresh operation on a 1st number of banks at one time such as the 1st mode. When the refresh command is inputted a predetermined 2nd number of input times after the 1st number of input times, the memory device may perform the refresh operation on a 2nd number of banks at one time such as the 2nd mode. When the refresh command is inputted a predetermined 3rd number of input times after the 2nd number of input times, the memory device may perform the target refresh operation.

For example, referring to FIG. 8F, the 1st number of input times of the refresh command may be 2 (corresponding to the 1st and 2nd refresh commands 801 and 802), the 2nd number of input times of the refresh command may be 2 (corresponding to the 3rd and 4th refresh commands 803 and 804), and the 3rd number of input times of the refresh command may be 2 (corresponding to the 3rd and 4th refresh commands 803 and 804).

For another example, referring to FIG. 8G, the 1st number of input times of the refresh command may be 2 (corresponding to the 1st and 2nd refresh commands 801 and 802), the 2nd number of input times of the refresh command may be 6 (corresponding to the 3rd and 8th refresh commands 803 to 808), and the 3rd number of input times of the refresh command may be 2 (corresponding to the 7th and 8th refresh commands 807 and 808).

For another example, referring to FIGS. 8H and 8I, the 1st number of input times of the refresh command may be 2 (corresponding to the 1st and 2nd refresh commands 801 and 802), the 2nd number of input times of the refresh command may be 14 (corresponding to the 3rd to 16th refresh commands 803 to 816), and the 3rd number of input times of the refresh command may be 2 (corresponding to the 15th and 16th refresh commands 815 and 816).

The 1st to 3rd number of input times of the refresh command may be changed according to the design of the memory device, and the methods are irrelevant as to when the predetermined refresh modes may be performed. Although FIGS. 8A to 8H illustrate the memory device operating in a four-piled refresh scheme, the memory device may operate in a two-piled refresh scheme or an 8th-piled refresh scheme or the other piled refresh schemes, not the four-piled refresh scheme, according to the design of the memory device.

Figure 9:
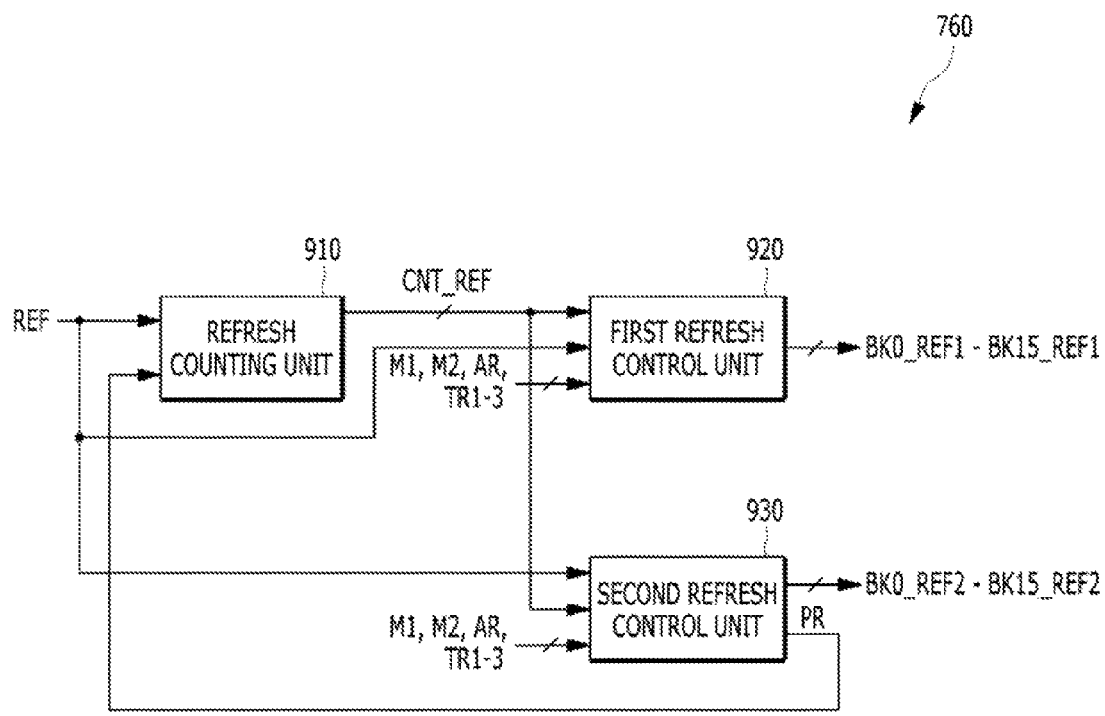
FIG. 9 is a block diagram illustrating a refresh control block 750.

FIG. 9 is a block diagram illustrating a refresh control block 750.

Referring to FIG. 9, the refresh control block 750 may include a refresh counting unit 910, a 1st refresh control unit 920, and a 2nd refresh control unit 930.

The refresh counting unit 910 may count the number of times that a refresh command REF is inputted and generate counting information CNT_REF. The refresh counting unit 910 is initialized when a target refresh signal TR corresponding to a target refresh section is disabled. Thus, the refresh counting unit 910 may initialize the counting information CNT_REF and count the number of times that the refresh command REF is inputted again, from the beginning.

The 1st refresh control unit 920 may control a normal refresh operation of the plurality of memory banks BK0 to BK15 in response to the refresh command REF, the counting information CNT_REF and mode information M1, M2, AR and TR1 to TR3.

The 2nd refresh control unit 930 may control a target refresh operation of the plurality of memory banks BK0 to BK15 in response to the refresh command REF, the counting information CNT_REF and the mode information M1, M2, AR and TR1 to TR3. The 2nd refresh control unit 930 may enable the target refresh signal TR when a target refresh section starts and disable the target refresh signal TR when the target refresh section ends.

Hereafter, the operations of the 1st and 2nd refresh control units 920 and 930 are described with reference to FIGS. 8A to 8I.

When the mode information M1 is enabled, and the mode information AR is disabled, and the mode information TR1 to TR3 are disabled in FIG. 8A, the 1st refresh control unit 920 may sequentially enable the normal bank refresh signals BK0_REF1 to BK15_REF1 once whenever the refresh command REF is inputted, and the 2nd refresh control unit 930 may disable the normal bank refresh signals BK0_REF1 to BK15_REF1.

When the mode information M1 is enabled, and the mode information AR is enabled, and the mode information TR1 to TR3 are disabled in FIG. 8B, the 1st refresh control unit 920 may sequentially enable the normal bank refresh signals BK0_REF1 to BK15_REF1 by twice whenever the refresh command REF is inputted, and the 2nd refresh control unit 930 may disable the normal bank refresh signals BK0_REF1 to BK15_REF1.

When the mode information M2 is enabled, and the mode information AR is enabled, and the mode information TR1 to TR3 are disabled in FIG. 8C, the 1st refresh control unit 920 may sequentially enable the normal bank refresh signals BK0_REF1 to BK7_REF1 or BK8_REF1 to BK15_REF1 once whenever the refresh command REF is inputted, and the 2nd refresh control unit 930 may disable the normal bank refresh signals BK0_REF1 to BK7_REF1 or BK8_REF1 to BK15_REF1.

When the mode information M2 is enabled, and the mode information AR is disabled, and the mode information TR1 is enabled in FIG. 8D, the 1st refresh control unit 920 may sequentially enable the normal bank refresh signals BK0_REF1 to BK15_REF1 once whenever the refresh command REF is inputted at a 1st time, and the 2nd refresh control unit 930 may sequentially enable the target bank refresh signals BK0_REF2 to BK15_REF2 twice whenever the refresh command REF is inputted at a 2nd time.

When the mode information M3 is enabled, and the mode information AR is disabled, and the mode information TR1 to TR3 are disabled in FIG. 8E, the 1st refresh control unit 920 may sequentially enable the normal bank refresh signals BK0_REF1 to BK7_REF1 or BK8_REF1 to BK15_REF1 once whenever the refresh command REF is inputted, and the 2nd refresh control unit 930 may disable the normal bank refresh signals BK0_REF1 to BK7_REF1 or BK8_REF1 to BK15_REF1.

When the mode information M3 is enabled, and the mode information AR is enabled, and the mode information TR1 is enabled in FIG. 8F, the 1st refresh control unit 920 may sequentially enable the normal bank refresh signals BK0_REF1 to BK15_REF1 once whenever the refresh command REF is inputted at 1st and 2nd times, and the 2nd refresh control unit 930 may sequentially enable the target bank refresh signals BK0_REF2 to BK7_REF2 or BK8_REF2 to BK15_REF2 twice whenever the refresh command REF is inputted at 3rd and 4th times.

When the mode information M3 is enabled, and the mode information AR is enabled, and the mode information TR2 is enabled in FIG. 8G, the 1st refresh control unit 920 may sequentially enable the normal bank refresh signals BK0_REF1 to BK15_REF1 once whenever the refresh command REF is inputted at 1st and 2nd times and sequentially enable the normal bank refresh signals BK0_REF1 to BK7_REF1 or BK8_REF1 to BK15_REF1 once whenever the refresh command REF is inputted at 3rd to 6th times, and the 2nd refresh control unit 930 may sequentially enable the target bank refresh signals BK0_REF2 to BK7_REF2 or BK8_REF2 to BK15_REF2 twice whenever the refresh command REF is inputted at 7th and 8th times.

When the mode information M3 is enabled, and the mode information AR is enabled, and the mode information TR3 is enabled in FIGS. 8H and 8I, the 1st refresh control unit 920 may sequentially enable the normal bank refresh signals BK0_REF1 to BK15_REF1 by once whenever the refresh command REF is inputted at 1st and 2nd times and sequentially enable the normal bank refresh signals BK0_REF1 to BK7_REF1 or BK8_REF1 to BK15_REF1 once whenever the refresh command REF is inputted at 3rd to $14^{th}$ times, and the 2nd refresh control unit 930 may sequentially enable the target bank refresh signals BK0_REF2 to BK7_REF2 or BK8_REF2 to BK15_REF2 twice whenever the refresh command REF is inputted at $15^{th}$ and $16^{th}$ times.

Figure 10:
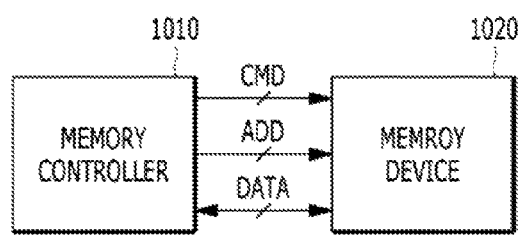
FIG. 10 is a block diagram illustrating a memory system in accordance with an embodiment of the present invention.

FIG. 10 is a block diagram illustrating a memory system in accordance with an embodiment of the present invention.

Referring to FIG. 10, the memory system may include a memory controller 1010 and a memory device 1020.

The memory controller 1010 may control an operation of the memory device 1020 by inputting commands CMD and addresses ADD to the memory device 1020 and exchange data DATA with the memory device 1020 during read and write operations. The memory device 1020 may set a refresh mode by transmitting the commands CMD and addresses ADD to the memory device 1020, and refresh commands may be applied to the memory device 1020 by transmitting the commands CMD. Since a counting address CNT_ADD internally generated by the memory device 1020 is used during a refresh operation, the memory controller 1010 does not need to transmit the addresses ADD to the memory device 1020.

The memory device 1020 sets the refresh mode by receiving the commands CMD and addresses ADD. The memory device 1020 performs the refresh operation in response to the refresh commands applied through the commands CMD from the memory controller 1010. The method for performing the refresh operation is determined based on predetermined refresh modes M1, M2, AR and TR1 to TR3. When the memory device 1020 is set to the 1st mode, the memory controller 1010 may input the refresh command at the 1st period, and when the memory device 1020 is set to the 2nd mode, the memory controller 1010 may input the refresh command at the 2nd period, and when the memory device 1020 is set to the 3rd mode, the memory controller 1010 may input the refresh command at the 3rd period. When the read/write command is applied from the memory controller 1010, the memory device 1020 exchanges data DATA with the memory controller 1010.

The memory device 1020 may satisfy refresh operation requirements coming from an external device by flexibly controlling the number of banks to be refreshed at one time and additionally perform target refresh operations on an internally-vulnerable word line.

In accordance with the embodiments of the present invention, the number of memory blocks where a refresh operation is performed at one time may be flexibly controlled.

Also, in accordance with the embodiments of the present invention, a predetermined number of refresh operations may be performed on each memory block to correspond to a condition for the number of the memory blocks set from an external device and, additionally, a target refresh operation may be performed by flexibly controlling the number of the memory blocks where the refresh operation is performed at one time.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A memory device comprising:
   a plurality of memory blocks;
   a mode setting block suitable for setting one of 1st to 3rd modes under control of a memory controller, wherein the 1st to 3rd modes are to refresh the plurality of memory blocks once, twice and four times, respectively; and
   a refresh control block suitable for controlling the plurality of memory blocks to be refreshed once or twice according to how many times a refresh command was inputted, when the 2nd mode is set by the mode setting block,
   wherein the refresh control block normally refreshes a word line corresponding to a counting address or target-refreshes a word line corresponding to a target address, according to how many times the refresh command was inputted.

2. The memory device of claim 1, wherein the refresh control block controls the plurality of memory blocks to be refreshed once, twice or four times according to how many times the refresh command was inputted, when the 3rd mode is set by the mode setting block.

3. The memory device of claim 1, wherein the refresh control block determines whether to refresh the plurality of memory blocks once, twice or four times according to a set mode among the 1st to 3rd modes, an average count, and the input count of the refresh command, the average count indicating how many times the plurality of blocks are target-refreshed during a predetermined period.

4. The memory device of claim 1, wherein when the 2nd mode is set, the plurality of memory blocks are normally refreshed once during a predetermined period, and the average count is 1, the refresh control block controls the plurality of memory blocks to be normally refreshed once in response to one refresh command of two refresh commands, and controls the plurality of memory blocks to be target-refreshed once in response to the other refresh command of the two refresh commands.

5. The memory device of claim 1, wherein when the 3rd mode is set, the plurality of memory blocks are normally refreshed twice during a predetermined period, and the average count is 1, the refresh control block controls the plurality of memory blocks to be normally refreshed twice in response to two refresh commands of four refresh commands, and controls the plurality of memory blocks to be target-refreshed once in response to the other two refresh commands of the four refresh commands.

6. The memory device of claim 1, wherein when the 3rd mode is set, the plurality of memory blocks are normally refreshed four times during a predetermined period, and the average count is 1, the refresh control block controls the plurality of memory blocks to be normally refreshed twice in response to two refresh commands of eight refresh commands, controls the plurality of memory blocks to be normally refreshed twice in response to other four refresh commands, and controls the plurality of memory blocks to be target-refreshed once in response to the other two refresh commands.

7. The memory device of claim 1, wherein when the 3rd mode is set, the plurality of memory blocks are normally refreshed eight times during a predetermined period, and the average count is 1, the refresh control block controls the plurality of memory blocks to be normally refreshed twice in response to two refresh commands of 16 refresh commands, controls the plurality of memory blocks to be normally refreshed six times in response to other 12 refresh commands, and controls the plurality of memory blocks to be target-refreshed once in response to the other two refresh commands.

8. The memory device of claim 1, wherein the target address comprises an address of a word line having a data retention time shorter than a reference time or an address of a word line adjacent to an word line having an active count equal to or more than a reference count, an active frequency equal to or more than a reference frequency, or an active time equal to or more than a reference time.

* * * * *